(12) United States Patent
Ricci et al.

(10) Patent No.: US 8,785,864 B2
(45) Date of Patent: Jul. 22, 2014

(54) ORGANIC-SCINTILLATOR COMPTON GAMMA RAY TELESCOPE

(75) Inventors: Kenneth N. Ricci, Redwood City, CA (US); Wayne B. Norris, Santa Barbara, CA (US); Brad Paden, Goleta, CA (US)

(73) Assignee: BOSS Physical Sciences LLC, Santa Barbara, CA (US)

( * ) Notice: Subject to any disclaimer, the term of this patent is extended or adjusted under 35 U.S.C. 154(b) by 207 days.

(21) Appl. No.: 13/497,739

(22) PCT Filed: Sep. 22, 2010

(86) PCT No.: PCT/US2010/049735
§ 371 (c)(1),
(2), (4) Date: Mar. 22, 2012

(87) PCT Pub. No.: WO2011/037945
PCT Pub. Date: Mar. 31, 2011

(65) Prior Publication Data
US 2012/0217386 A1 Aug. 30, 2012

Related U.S. Application Data

(60) Provisional application No. 61/244,570, filed on Sep. 22, 2009.

(51) Int. Cl.
*G01V 5/00* (2006.01)
*G01T 1/20* (2006.01)
*H01L 31/0203* (2014.01)
*H01L 27/146* (2006.01)

(52) U.S. Cl.
CPC ............... *G01V 5/0008* (2013.01); *G01T 1/20* (2013.01); *H01L 31/0203* (2013.01); *H01L 27/14663* (2013.01)
USPC ........................................................ 250/367

(58) Field of Classification Search
USPC ........................................................ 250/367
See application file for complete search history.

(56) References Cited

U.S. PATENT DOCUMENTS 3,041,287 A * 6/1962 Hyman, Jr. ............... 252/301.18
3,463,922 A   8/1969 Senftle et al.

(Continued)

FOREIGN PATENT DOCUMENTS

EP   1882929 A   1/2008
JP   2099811 A   4/1990

(Continued)

OTHER PUBLICATIONS

Dogan et al., "Efficiency and angular resolution calculations for a prototype multiple Compton scatter camera," 1994, Nuclear Instruments and Methods in Physics Research A, vol. 345, pp. 296-302.

(Continued)

*Primary Examiner* — Constantine Hannaher
(74) *Attorney, Agent, or Firm* — Endurance Law Group, PLC

(57) ABSTRACT

Apparatus and methods for imaging sources of gamma rays with a large area, comparatively low-cost Compton telescope (20). The Compton telescope (20) uses multiple layers (24) of low-cost organic solid plastic or liquid scintillator, arranged in large arrays of identical scintillator pixels (28). Photodiodes, avalanche photodiodes (30), or solid-state photomultipliers are used to read out the fluorescent pulses from scintillator pixels (28). Multiple scintillator pixels (28) are multiplexed into a few fast digitizers (80) and a few fast FPGA programmable digital microprocessors (78). Selection rule methods are presented for processing multiple near-simultaneous gamma ray collisions within the Compton telescope (28) to identify trackable events that yield gamma ray image data of interest. A calibration method achieves improved energy resolution along with (x,y) position information in pixels (28) made of organic scintillator materials with multiple photodetectors (30). Synchronization trigger signals are used from a pulsed neutron source (58) to maximize the signal-to-background ratio for prompt gamma neutron activation analysis (PGNAA) of objects at greater than 2 meters range, where such trigger signals are based on the estimated range to PGNAA sources and neutron time-of-flight.

25 Claims, 12 Drawing Sheets

(56) References Cited

U.S. PATENT DOCUMENTS

| | | | |
|---|---|---|---|
| 3,581,090 | A * | 5/1971 | Brown .................. 250/363.01 |
| 3,717,763 | A * | 2/1973 | Tanaka et al. ............. 250/363.02 |
| 3,732,420 | A * | 5/1973 | Brunnett et al. ............ 250/252.1 |
| 3,781,564 | A | 12/1973 | Lundberg |
| 3,832,545 | A | 8/1974 | Bartko |
| 4,529,571 | A | 7/1985 | Bacon et al. |
| 4,613,756 | A | 9/1986 | Iwanczyk et al. |
| 4,616,833 | A | 10/1986 | Geller |
| 4,851,687 | A | 7/1989 | Ettinger et al. |
| 4,882,121 | A | 11/1989 | Grenier |
| 4,941,162 | A | 7/1990 | Vartsky et al. |
| 4,987,582 | A | 1/1991 | Webster et al. |
| 5,006,299 | A | 4/1991 | Gozani et al. |
| 5,040,200 | A | 8/1991 | Ettinger et al. |
| 5,076,993 | A | 12/1991 | Sawa et al. |
| 5,078,952 | A | 1/1992 | Gozani et al. |
| 5,080,856 | A | 1/1992 | Grenier et al. |
| 5,114,662 | A | 5/1992 | Gozani et al. |
| 5,124,554 | A | 6/1992 | Fowler et al. |
| 5,153,439 | A | 10/1992 | Gozani et al. |
| 5,159,617 | A | 10/1992 | King et al. |
| 5,247,177 | A | 9/1993 | Goldberg et al. |
| 5,278,418 | A | 1/1994 | Broadhurst |
| 5,293,414 | A | 3/1994 | Ettinger et al. |
| 5,388,128 | A | 2/1995 | Gozani |
| 5,410,156 | A | 4/1995 | Miller |
| 5,410,575 | A | 4/1995 | Uhm |
| 5,420,905 | A | 5/1995 | Bertozzi |
| 5,442,180 | A * | 8/1995 | Perkins et al. ................. 250/367 |
| 5,600,303 | A | 2/1997 | Husseiny et al. |
| 5,606,167 | A | 2/1997 | Miller |
| 5,692,029 | A | 11/1997 | Husseiny et al. |
| 5,838,759 | A | 11/1998 | Armistead |
| 5,847,398 | A | 12/1998 | Shahar et al. |
| 5,880,469 | A | 3/1999 | Miller |
| 5,982,838 | A | 11/1999 | Vourvopoulos |
| 6,215,122 | B1 | 4/2001 | Clifford et al. |
| 6,341,150 | B1 | 1/2002 | Ivanov et al. |
| 6,393,085 | B1 | 5/2002 | Heller et al. |
| 6,399,951 | B1 | 6/2002 | Paulus et al. |
| 6,444,994 | B1 | 9/2002 | Ohmori et al. |
| 6,472,667 | B1 * | 10/2002 | Kline et al. ............. 250/370.09 |
| 6,563,898 | B1 | 5/2003 | Vourvopoulos et al. |
| 6,791,090 | B2 * | 9/2004 | Lin et al. .................. 250/367 |
| 6,906,559 | B2 | 6/2005 | Tuemer |
| 6,922,455 | B2 | 7/2005 | Jurczyk et al. |
| 6,928,131 | B2 | 8/2005 | Olshansky et al. |
| 7,049,600 | B2 * | 5/2006 | Levin ..................... 250/363.04 |
| 7,151,447 | B1 | 12/2006 | Willms et al. |
| 7,151,815 | B2 | 12/2006 | Ruddy et al. |
| 7,313,221 | B2 | 12/2007 | Sowerby et al. |
| 7,362,842 | B2 | 4/2008 | Leung |
| 7,385,201 | B1 | 6/2008 | Joung et al. |
| 7,405,409 | B2 | 7/2008 | Kearfott |
| 7,430,479 | B1 | 9/2008 | Holslin et al. |
| 7,461,032 | B2 | 12/2008 | Heaton et al. |
| 7,501,624 | B1 | 3/2009 | Farrell et al. |
| 7,505,544 | B2 | 3/2009 | Jestice |
| 7,554,089 | B2 | 6/2009 | Burr et al. |
| 2002/0121603 | A1 | 9/2002 | Wong et al. |
| 2002/0131543 | A1 | 9/2002 | Leung |
| 2003/0161526 | A1 | 8/2003 | Jupiter et al. |
| 2003/0165212 | A1 | 9/2003 | Maglich |
| 2004/0008810 | A1 | 1/2004 | Nelson et al. |
| 2004/0036025 | A1 | 2/2004 | Wong et al. |
| 2004/0228433 | A1 | 11/2004 | Magill et al. |
| 2004/0251400 | A1 | 12/2004 | Moses et al. |
| 2005/0058352 | A1 | 3/2005 | Deliwala |
| 2005/0069073 | A1 | 3/2005 | Ogura et al. |
| 2005/0135534 | A1 | 6/2005 | Jones et al. |
| 2005/0139775 | A1 | 6/2005 | Gono et al. |
| 2006/0140326 | A1 | 6/2006 | Rowland et al. |
| 2006/0202125 | A1 | 9/2006 | Suhami |
| 2006/0210007 | A1 | 9/2006 | Koskelo et al. |
| 2007/0295911 | A1 | 12/2007 | Sved |
| 2008/0011052 | A1 | 1/2008 | Kondo et al. |
| 2008/0017806 | A1 | 1/2008 | Norris |
| 2008/0128631 | A1 | 6/2008 | Suhami |
| 2008/0192897 | A1 | 8/2008 | Piorek et al. |
| 2008/0203309 | A1 | 8/2008 | Frach et al. |
| 2008/0210878 | A1 * | 9/2008 | Friedman ..................... 250/374 |
| 2009/0095895 | A1 | 4/2009 | Dent |
| 2009/0114834 | A1 | 5/2009 | Pekarsky |
| 2009/0134334 | A1 * | 5/2009 | Nelson ..................... 250/361 R |
| 2010/0025573 | A1 | 2/2010 | Hahto et al. |
| 2010/0219345 | A1 | 9/2010 | Franch et al. |
| 2010/0223010 | A1 | 9/2010 | Nikitin et al. |
| 2011/0186720 | A1 * | 8/2011 | Jongen et al. ............... 250/252.1 |

FOREIGN PATENT DOCUMENTS

| | | | |
|---|---|---|---|
| JP | 2001051094 | A | 2/2001 |
| KR | 100716495 | B1 | 5/2007 |
| WO | 9016072 | A | 12/1990 |
| WO | 9857194 | A | 12/1998 |
| WO | 0194984 | A | 12/2001 |
| WO | 03040713 | A | 5/2003 |
| WO | 2004043740 | A | 5/2004 |
| WO | 2005008285 | A | 1/2005 |
| WO | 2006016835 | A | 2/2006 |

OTHER PUBLICATIONS

Kwan et al., Bulk Explosives Detection Using Nuclear Resonant Absorption Technique, Plasma Science, Jun. 2-5, 2003, p. 396.

* cited by examiner

ORGANIC-SCINTILLATOR COMPTON GAMMA RAY TELESCOPE

BACKGROUND OF THE INVENTION

1. Field of the Invention

The present invention relates to systems and methods for imaging distant or near sources of gamma rays using the Compton Effect.

2. Related Art

Systems and methods for imaging distant or nearby sources of gamma rays using the Compton Effect are commonly referred to as a Compton telescope. A Compton telescope typically comprises one or many gamma ray detectors combined with electronics to determine the direction and energy of gamma rays incident on the telescope. Since gamma rays are not easily focused by refractive or reflective optics in the manner of visible light and lower energy photons, existing Compton telescopes usually do not rely on focusing optics to form images, but instead use the physics of Compton scattering and multiple particle interactions within the telescope to determine the energy and momentum (and hence direction) of incident gamma rays.

Gamma ray detectors may be classified into several types according to their composition and principles of operation. The different types vary widely in their cost, available size, and detection capabilities. These classifications may include Gas Ionization detectors, Organic scintillators, Inorganic scintillators and Semiconductor Gamma Ray Detectors. Each type is discussed briefly below.

Gas Ionization detectors such as the well-known Geiger-Müller Tube or Geiger Counter produce a pulse of electric current when a gamma ray or other energetic particle ionizes an inert gas in a high voltage chamber. Low-cost gas ionization detectors (<$200 (USD) each) such as the Geiger Counter count gamma rays above a certain energy threshold but cannot measure the energy of the gamma ray. More expensive Geiger-Müller proportional ionization detectors can measure the energy deposited by a gamma ray. Very expensive (>$100,000) multi-wire proportional gas ionization chambers can measure the energy and also track the momentum of charged particles that recoil from multiple gamma ray collisions, allowing imaging of gamma ray sources.

Organic scintillators are typically solid organic polymers (plastics) like polyvinyl toluene (PVT) or liquid organic solvents like benzene containing fluorescent organic compounds (fluors) like 2,5-diphenyloxazole (PPO). When a gamma ray interacts with a scintillator, it deposits energy that excites nearby fluors. The fluors emit visible light proportional to the amount of energy deposited, and this visible light can be measured with photomultiplier tubes (PMTs) or photodiodes. Typical plastic scintillators in bulk quantities cost less than $80 per kilogram (1 kg PVT is about 1 Liter volume), while liquid scintillators may be an order of magnitude less expensive per unit volume. (David C. Stromswold, Edward R. Siciliano, John E. Schweppe, James H. Ely, Brian D. Milbrath, Richard T. Kouzes, and Bruce D. Geelhood, "A Comparison of Plastic and NaI(Tl) Scintillators for Vehicle Portal Monitor Applications," *IEEE Nuclear Science Symposium Conference Record* 2003, Vol. 2, p. 1065 (2003).). For large volume particle detectors, these materials are among the least expensive known. Organic scintillators are usually used for counting gamma rays but not for measuring their energy, because the low density and low nuclear charge Z of these organic materials result in poor capture efficiency: a gamma ray with energy over 100 keV will usually Compton scatter out of an organic detector several cm in size, depositing some but not all of its energy.

Inorganic scintillators are typically fluorescing salt or oxide crystals of much higher density and higher nuclear charge Z than organic scintillators. The most common and least expensive is thallium-doped sodium iodide or NaI(Tl). Inorganic scintillators have much higher gamma ray capture efficiency than organic scintillators, and are often used to measure the energy of gamma rays in the range 10 keV to 3 MeV for laboratory, research, safety, environmental monitoring, minerals exploration, and security purposes. A typical block of inorganic scintillator can measure the energy of gamma rays between 500 keV and 3 MeV with 3% to 7% energy resolution. As a common laboratory example, a 7.5 cm diameter×7.5 cm long cylinder of NaI(Tl) has about 30% efficiency in capturing the full energy of incident monoenergetic 2.2 MeV gamma rays from the nuclear reaction $n+p \rightarrow {}^2H+2.2$ MeV $\gamma$. An energy spectrum of this gamma ray source in such a NaI(Tl) detector would show a peak at 2.2 MeV with a 5% full-width-at-half-maximum (FWHM) resolution. Sodium iodide scintillators in bulk quantities currently cost at least $2500 per cubic decimeter (Liter volume), while other inorganic scintillators with higher capture efficiency and better energy resolution cost from 3× to 10× as much per unit volume.

Semiconductor Gamma Ray Detectors are based on doped silicon, germanium, and similar semiconductors, placed across high voltage electrodes and often cooled to cryogenic temperatures for better performance. When a gamma-ray interaction excites electrons from the valence band to the conduction band in these materials, a conduction current flows between the electrodes, giving a very accurate measurement of the energy deposited by the gamma ray. Detectors of this type usually have higher capture efficiency per unit volume than organic scintillators but lower capture efficiency than inorganic scintillators. Semiconductor detectors have the best energy resolution of all standard particle detectors, able to measure 100 keV to 3 MeV events with better than 1% energy resolution and in some cases better than 0.1% FWHM. Semiconductor detectors also have the highest cost per unit volume, currently over $100,000 per cubic decimeter, although semiconductor detectors greater than a few hundred cubic cm are never in practice manufactured as a single detector element, but typically as a segmented array of detector strips or blocks for particle tracking.

Compton telescopes have been designed, built, and operated for astrophysical observations. These include the CompTel Gamma Ray Telescope, launched in 1991 on the Compton Gamma Ray Observatory satellite (CGRO). CompTel used a two-layer Compton telescope design consisting of organic Ne-213A liquid scintillator cells in the first layer and NaI(Tl) inorganic scintillator blocks in the second layer. According to published statistics, CompTel has an upper layer active area of 4188 cm² with a gamma ray captures efficiency from 1.2% to 0.5% for gamma rays in the energy range 0.8 MeV to 30 MeV, with an energy resolution of 5% to 8% FWHM and angular resolution 2° to 4° for gamma rays over this energy range. Since CompTel was launched, the United States Naval Research Lab (NRL) along with many partner institutions has proposed several successor Compton telescope instruments including the ATHENA concept and the ACT concept. These proposed designs achieve higher performance than CompTel but require higher component costs, using arrays of semiconductor detectors typically in conjunction with scintillators to achieve higher gamma ray capture efficiency, better energy and angular resolution than CompTel, and in some cases a wider range of gamma ray energies.

NRL developed a significant theoretical breakthrough with the 3-*Compton Principle*. R. A. Kroeger, W. N. Johnson, et al, "Three-Compton Telescope: Theory, Simulations, and Performance," *IEEE Trans. Nucl. Science*, Vol. 49, No. 4, p. 1887 (2002). See also U.S. Pat. No. 6,528,759, to Kurfess et al, issued Mar. 4, 2003. This discovery shows how the energy and direction vector of an incident gamma ray can be recovered in a Compton telescope if the gamma ray Compton-scatters 3 times or more inside the device. Prior to this discovery, CompTel and other early Compton telescopes only processed gamma ray events that interacted in exactly two detector layers. The 3-Compton Principle allows Compton telescopes of much higher capture efficiency, since an arbitrary number of layers of detector material may be used.

Previous large-area Compton telescopes have existed only as one-of-a-kind research instruments, with many hand-assembled components built by graduate students, laboratory engineers, and post-doctoral scientists, usually for astrophysical research applications. As a result, these large Compton instruments typically cost many millions of (US) dollars. Smaller Compton-scatter imaging systems have been built for medical research applications, but these generally use very expensive cryogenic semiconductor elements that cannot be scaled up cost-effectively to large collection areas.

There are several current applications that would benefit from a Compton telescope with a large collection area (from several square feet up to several square meters), high gamma ray capture efficiency, modest cost, and modest energy and angular resolution requirements. For example, in the field of Homeland Security, a large area Compton telescope would be useful for monitoring points of national entry and major urban centers to search for smuggled nuclear weapons, radiological dirty bombs, or Special Nuclear Materials (SNMs). However, the exceptionally high cost of existing Compton telescope designs renders this technology outside the realm of practical reality.

Another likely application is in the detection of large concealed explosives such as the roadside Improvised Explosive Devices (IEDs) used by insurgents in conflict areas to attack convoys of vehicles, or concealed vehicle-born explosives moving through a security checkpoint toward a sensitive target such as a federal building, landmark skyscraper, bridge, or crowded stadium. While conventional explosives do not emit gamma rays, they can be identified by the method of Prompt-Gamma Neutron Activation Analysis (PGNAA), using a neutron source to probe a suspected target and a gamma ray detector to analyze the element-specific gamma rays emitted by the material. This technique is described in detail in U.S. Pat. No. 7,573,044 to Norris, issued Aug. 11, 2009, the entire disclosure of which is hereby incorporated by reference.

In the past, PGNAA has been used successfully to identify concealed explosives inside metal containers at ranges up to about 50 cm from a neutron source and gamma detector. To make a useful IED or vehicle-born explosive detector, the effective PGNAA range must be extended to at least several meters, and this requires a large area gamma ray detector with imaging capability to distinguish threatening concentrations of nitrogen from harmless background concentrations such as are found in ambient air.

As yet another exemplary application, it has been estimated that there are billions of (US) dollars of recoverable metals in mining tailings around the world. Currently, the cost of assaying very large fields of mining tailings is often high enough to prevent the recovery of much of this metal, since the process requires samples to be collected from survey locations, analyzed chemically in a laboratory for minerals of interest, and then after a delay, the mineral content of tailings zones is reconstructed from the lab results. PGNAA with a range of several meters could allow mineral concentrations for large volumes of tailings to be analyzed more promptly on site, making minerals recovery from tailings more profitable.

Accordingly, there is a need in the art for a low cost, large-collection-area Compton telescope. However, one perceived obstacle to the prospect of low cost, large-collection-area Compton telescopes has been the assumption, in the gamma ray detector literature, that organic scintillators cannot measure particle energy accurately enough. As H. H. Vo and colleagues at the University of Osaka have recently shown (H. H. Vo, S. Kanamaru, C. Marquet, H. Nakamura, M. Nomachi, F. Piquemal, J. S. Ricol, Y. Sugaya, and K. Yasuda, "Energy Resolution of Plastic Scintillation Detector for Beta Rays", IEEE Trans. Nucl. Science, Vol. 55, No. 6, p. 3723, 2008), plastic scintillators can indeed measure particle energy accurately enough, but not when coupled to a single photomultiplier tube (PMT) as in the standard apparatus in the art of gamma ray detection. Because plastic scintillators have low gamma ray stopping power and imperfect optical transparency, they do not produce a uniform optical signal from everywhere within the volume of a single organic scintillator element large enough to capture a statistically significant fraction of energetic gamma rays. H. H. Vo and colleagues showed that by coupling multiple photodetectors to a single large plastic scintillator element, the sum of the signals of the multiple photodetectors could produce a consistent energy measurement with adequate energy resolution (7% to 4% resolution for particles in the energy range from 700 keV to 1700 keV).

SUMMARY OF THE INVENTION

According to the invention, a Compton telescope-type gamma-ray imaging device is provided including a plurality of scintillators. The device includes a chassis. The chassis includes at least three discrete layers spaced-apart from one another and supported in an aligned, generally parallel orientation. At least one gamma ray detector is operatively disposed in each layer. Each gamma ray detector comprises a plurality of scintillator pixels. The gamma ray detectors on at least two of the layers include organic scintillator pixels.

According to another aspect of the invention, a method of operating a Compton telescope-type gamma-ray imaging device including plural scintillators is provided. The method comprises the steps of: supporting at least three discrete layers of gamma ray detectors in spaced-apart generally parallel alignment; each said gamma ray detector including a plurality of substantially identical scintillator pixels; and forming a plurality of the scintillator pixels in at least two of the layers from an organic scintillator material composition.

The present invention enables the manufacture and operation of low-cost, large-collection-area Compton telescopes by configuring arrays of organic scintillator pixels on multiple detector layers.

BRIEF DESCRIPTION OF THE DRAWINGS

These and other features and advantages of the present invention will become more readily appreciated when considered in connection with the following detailed description and appended drawings, wherein.

DETAILED DESCRIPTION OF THE PREFERRED EMBODIMENT

Figure 1:
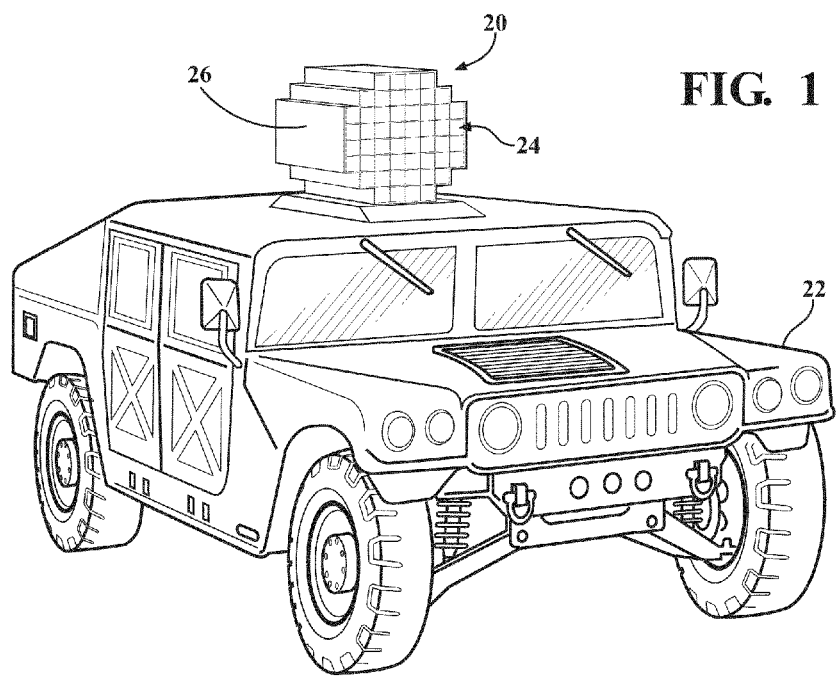
FIG. 1 is a perspective view showing one exemplary embodiment of the subject invention wherein the telescope apparatus is carried upon a land vehicle in a position for receiving signals from a search area.

FIG. 1 provides an exemplary context for the application of a Compton telescope 20 according to this invention mounted to a land vehicle 22 for transport to detect for example concealed roadside explosives such as Improvised Explosive Devices (IEDs), or alternatively a non-military application to assess mineral concentrations in mine tailings on site. It is to be understood that the Compton telescope 20 may be used in a wide variety of both civilian and military applications, including stationary or fixed mount uses in addition to the mobile applications suggested by FIG. 1. The telescope 20 includes a chassis comprising a plurality of gamma ray detector layers 24. The layers 24 are supported within a frame and/or housing walls 26 in a spaced-apart, aligned and generally parallel orientation.

Figure 2:
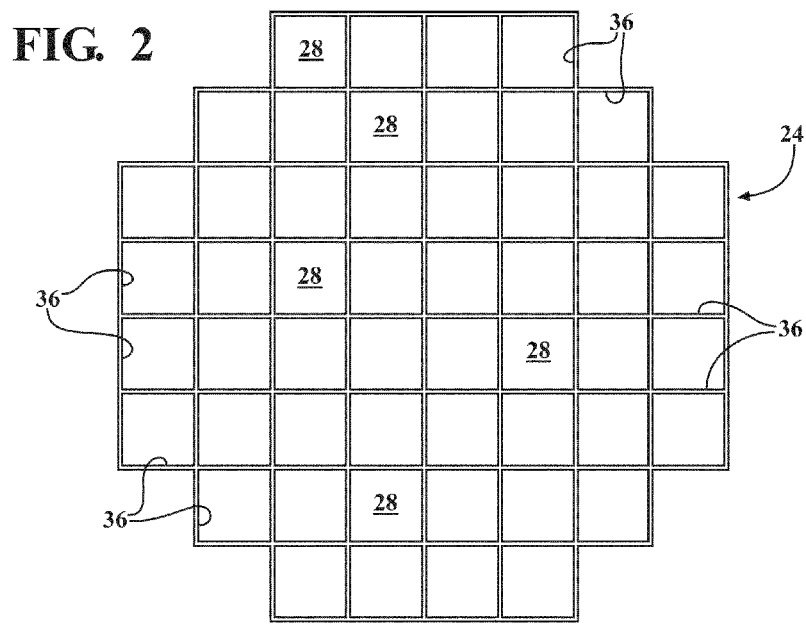
FIG. 2 is a front view of an exemplary pixel geometry for one embodiment of the present invention.
Figure 3:
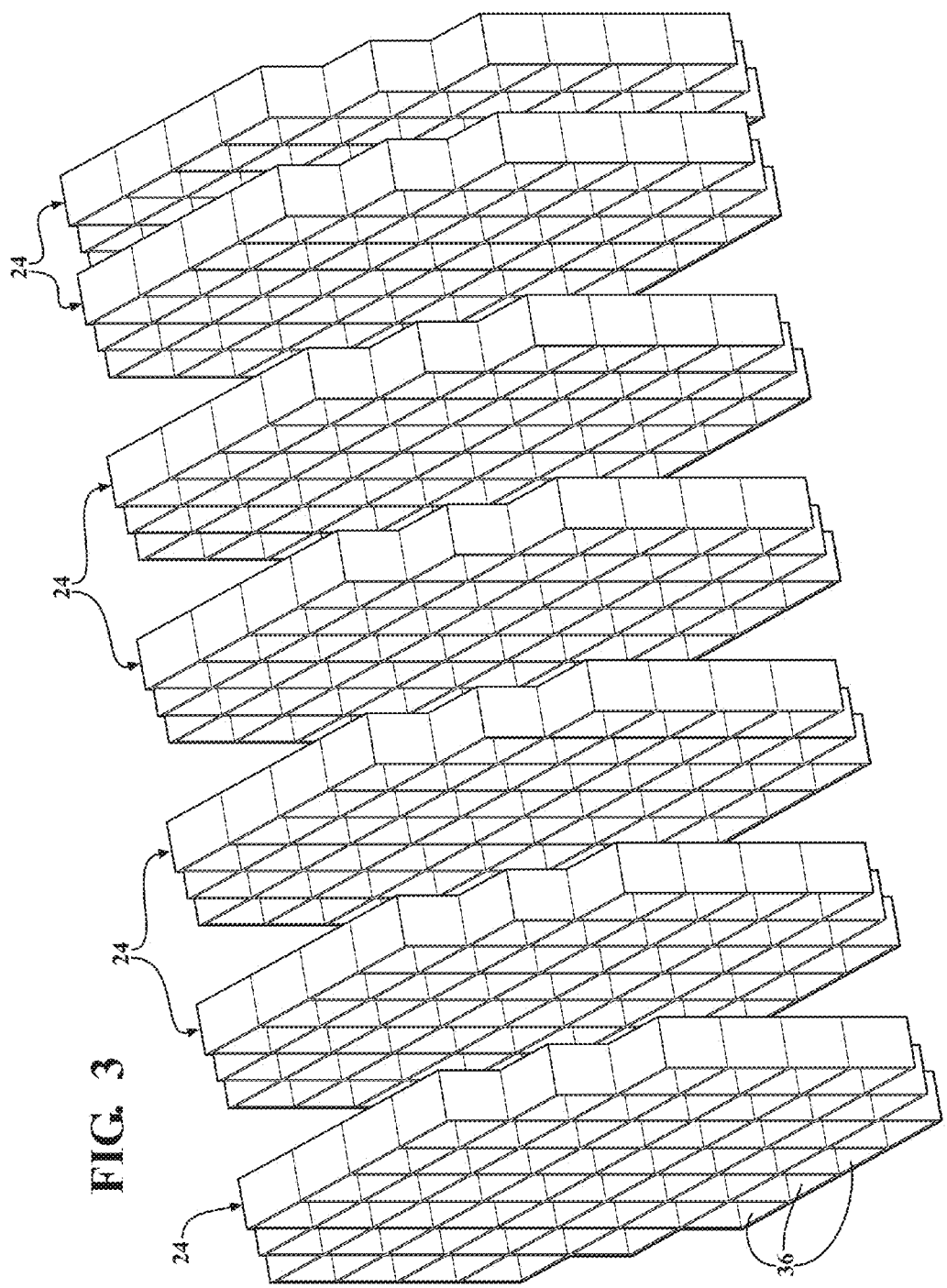
FIG. 3 is a perspective view of the multiple layers of scintillators for an embodiment of the present invention.

FIGS. 2 and 3 show views of the pixel 28 geometry of one embodiment of the present invention. In this exemplary embodiment the Compton telescope 20 contains seven (7) detector layers 24 composed of a plurality of organic scintillator pixels 28. Each layer 24 contains 52 pixels 28 arranged in a roughly circular array with approximately one square meter frontal area. This configuration was modeled with PVT plastic scintillator layers 24 10 cm thick, 14×14 cm square pixel 28 faces, and with 10 cm gaps separating the first six (6) layers 24 to give an overall Compton telescope 20 length of approximately 120 cm. Monte Carlo models of gamma-ray transport using the MCNP5 code developed at Los Alamos National Lab showed that up to 15% of 10.8 MeV gamma rays incident on the front face could be tracked by this Compton telescope 20 geometry. Other embodiments could increase or decrease the number of scintillator layers, increase or decrease the number of pixels 28 per layer 24, and/or replace the PVT plastic scintillator pixels 28 with liquid-scintillator-filled cells 28 of the same or similar dimensions, operating according to the same principles. Thus, the scintillator pixel 28 may be perceived in any suitable form including as a block of solid organic scintillator material or a container of liquid organic scintillator material. Said another way, each scintillator pixel 28 includes a unitary volume of scintillator material that is preferably homogenous in its composition. As shown in FIG. 3, the last two layers 24, i.e., those positioned proximate the back of the telescope 20, may stationed slightly closer together or even in direct contact as compared to the regular spacing between the forward most layers 24 to provide a backstop, as will be readily understood by those skilled in the art.

Each layer 24 of the Compton telescope 20 includes 50 to 100 pixels 28, preferably 15×15 cm in area×10 cm thick, producing a total collection area of preferably one square meter. The number of layers, number of pixels 28 per layer, and number of photodetectors per pixel 28 may be determined based on an analysis of performance vs. cost, because increasing the number of photodetectors, pixels 28 and layers 24 will increase the size, cost, and performance of the instrument. The proposed 10 cm thickness of each layer 24 has been shown to be effective for Compton telescope 20 capture and tracking of 10.8 MeV gamma rays, based on Monte-Carlo analysis of gamma ray transport using the MCNP5 code developed at Los Alamos National Labs, and separate Monte-Carlo analyses of scintillator light transport and diffuse reflection within each pixel. For other applications, generally thinner PVT layers 24 could be chosen because most terrestrial gamma ray sources produce energies lower than 10.8 MeV.

Figure 4:
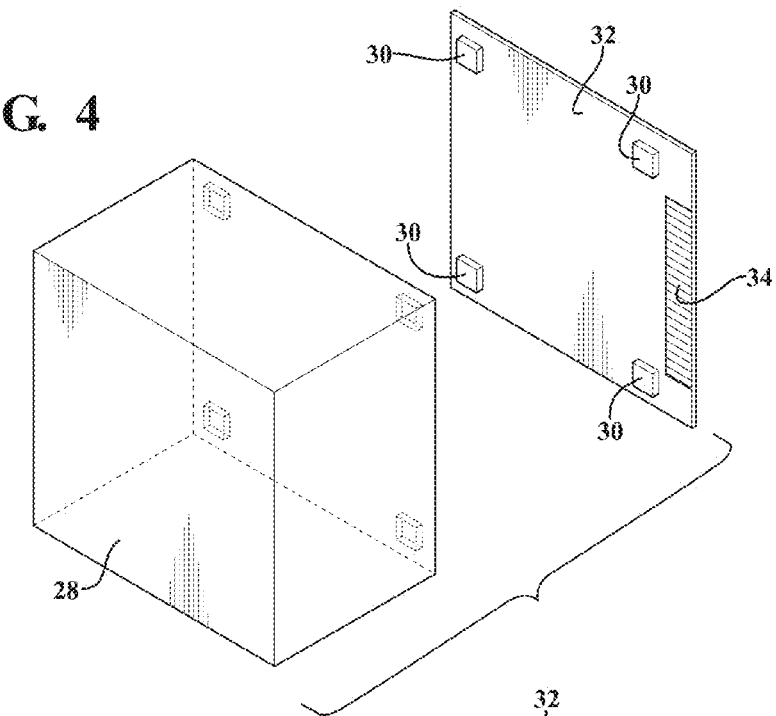
FIG. 4 is an exemplary subassembly in which four avalanche photodiodes are mounted on a printed circuit board at the corners of a square scintillator pixel.

FIG. 4 shows a subassembly of one possible pixel 28 embodiment in which four avalanche photodiodes 30 are mounted on a printed circuit board 32 at the corners of a square scintillator pixel 28. Pre-amplifiers, analog filters, and the other circuit components suggested in FIG. 6 could be soldered to the printed circuit board 32 by automated pick-and-place machines using solder reflow or other printed circuit (preferably mass-production) techniques. The circuit board 32 has a card-edge connector 34 or similar socket-based electronic connector allowing signals and power supply traces to be interfaced quickly to a large chassis, and allowing damaged pixels 28 to be replaced easily if needed. When the circuit board 32 is fully populated with components, it passes through an automated quality-check system and then is placed into an optical components assembly line, where the printed circuit board 32 and its avalanche photodiodes 30 can be mounted onto the organic scintillator cube 28 using index-matching optical adhesives of the type typically used in automated optical telecommunications assembly. While this embodiment depicts four (4) photodiodes 30, the invention will function with at least three (3), or more than four (4), photodiodes 30 of the semiconductor-based high-gain variety mounted directly to the unitary volume of scintillator material. In this manner, the photodiodes 30 are configured to determine the (x,y) position and total energy deposited by a gamma ray collision inside the scintillator pixel 28.

In one preferred embodiment of this Compton telescope, optimized for detection of 10.8 MeV gamma rays from materials at standoff ranges of 10 meters or more, 5 to 10 layers 24 of plastic scintillator are made of PVT containing dissolved fluors. The most likely candidate plastic scintillator materials are BC428 provided by Saint Gobain Crystals Inc. and EJ260 provided by Eljen Technology, because these scintillators are available at low cost and high quality, and they produce scintillation light in the blue-green range (490 nm) of the optical spectrum instead of the blue-violet range (410 nm) where most scintillators are active. Available photodiodes and avalanche photodiodes 30 are more sensitive to green light than to blue light.

Figure 5:
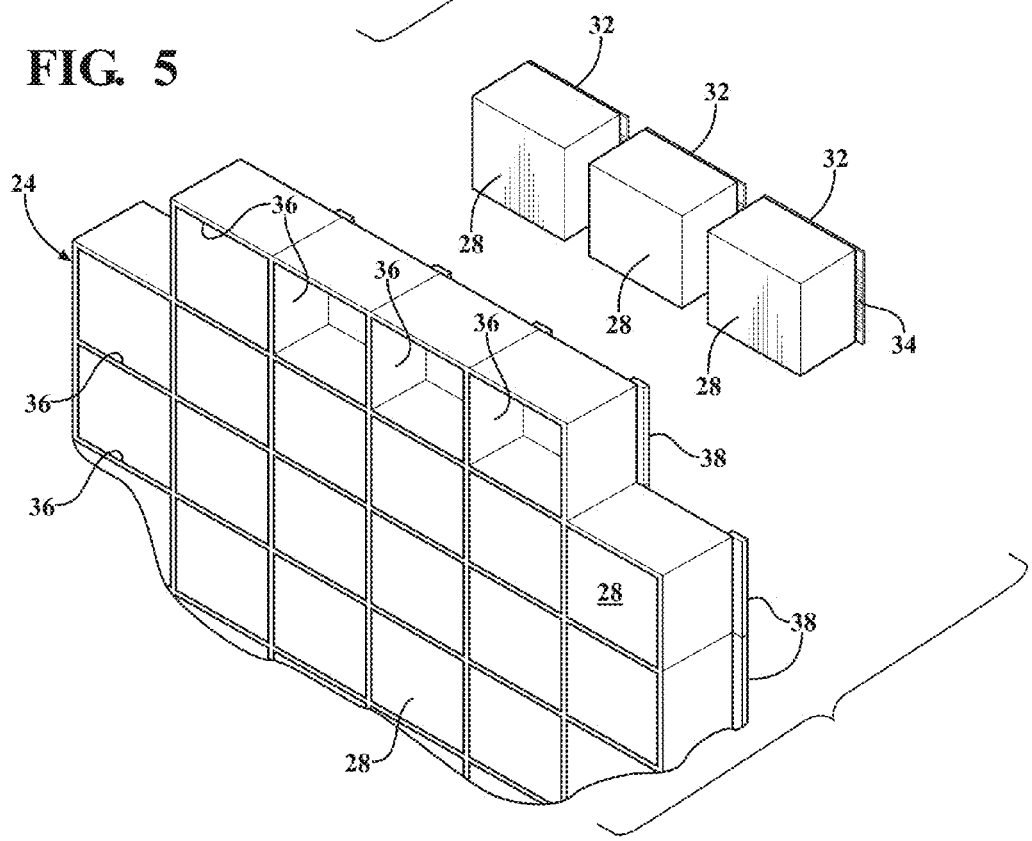
FIG. 5 shows a fragmentary perspective, partially exploded view of a chassis layer of the type for holding a plurality of identical organic scintillator pixels according to the invention.
Figure 9:
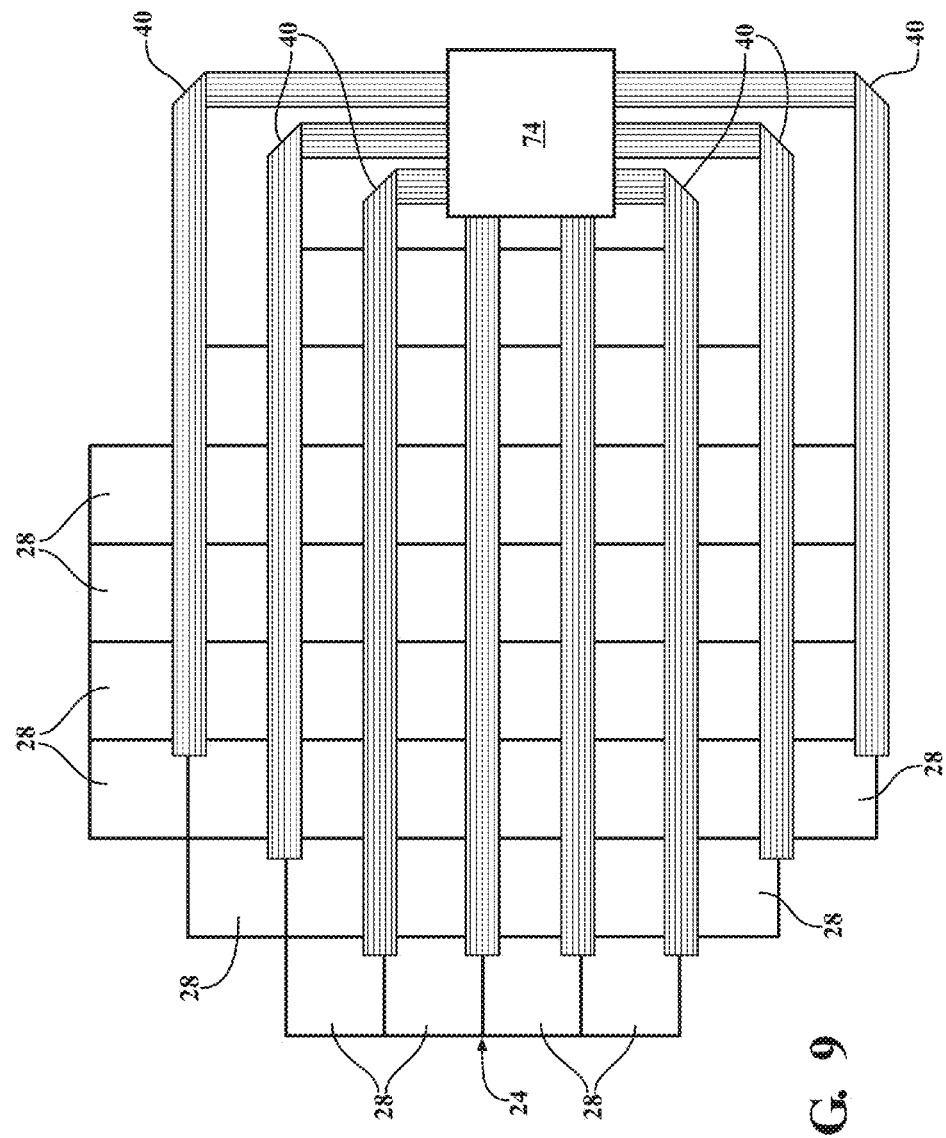
FIG. 9 is a schematic diagram of a signal processing subsystem for one example embodiment.
Figure 10:
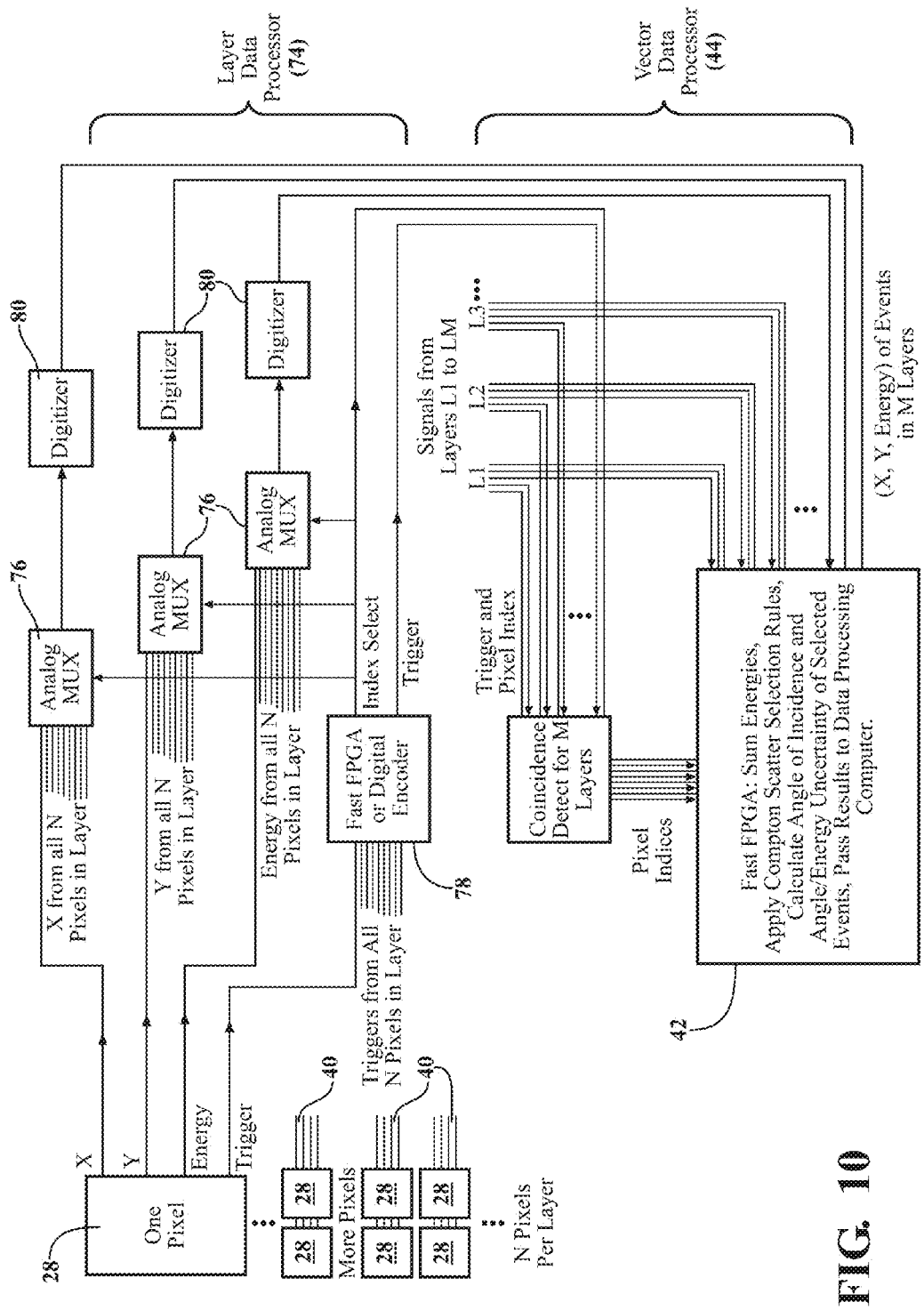
FIG. 10 is a schematic diagram of another signal processing subsystem for one example embodiment.

FIG. 5 shows another subassembly of one possible embodiment, a cut-away view of part of a single layer 24 of a chassis for holding tens or hundreds of identical organic scintillator pixels 28. Three example pixels 28 are shown at the top of the image. Each pixel 28 slides into its mounting bracket 36 in the chassis frame, which could be constructed of metal, polymer, or composite materials depending on structural requirements. Clamps, fasteners, or similar devices lock each scintillator block 28 in its place after the electronic connector 34 has been inserted into its electronic socket 38 along the side of each pixel 28 mounting pocket in the bracket 36. Ribbon cables 40 or similar signal cables bring the signals from each pixel 28 to the Layer Data 74 and Vector Data 74 signal processing systems (FIGS. 9 and 10). The full Compton telescope 20 chassis preferably comprises at least three (3) layers 24 rigidly mounted into a frame and/or housing walls 26 in geometry like that shown for example in FIGS. 1-3. The external frame and/or housing walls 26 also hold gamma ray and neutron shielding, and may include sheets of coincidence or anti-coincidence scintillator layers 24 as needed to reject charged particles scattered into the detector through the telescope 20 sides, or to detect electron-positron pairs escaping from gamma ray events within the Compton telescope 20. In one possible embodiment of this invention, each chassis layer 24 has at least one associated Field Programmable Gate Array (FPGA) microprocessor 78 (FIG. 10) to calculate the energy and coordinates of trigger-generating gamma ray events in that layer, and all layers 24 communicate their events to the Vector Data processing system 44, which applies selection criteria to the events and reconstructs selected gamma ray tracks.

Figure 6:
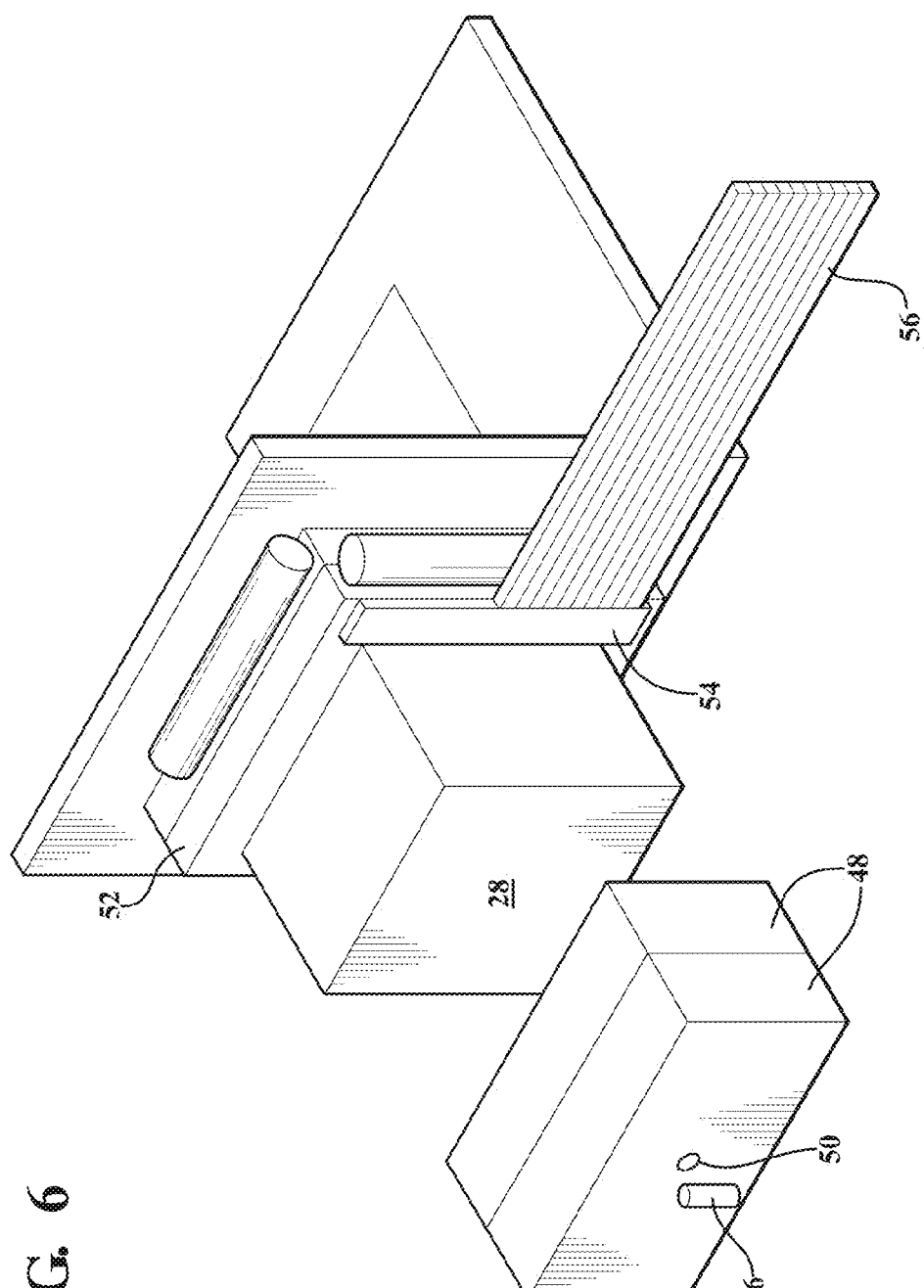
FIG. 6 is a perspective view of an exemplary automated system for calibrating each pixel after its circuit board is populated and mounted on the scintillator, but before the pixel is mounted into the Compton telescope chassis.

FIG. 6 shows an example of an automated system, in one possible embodiment of the invention, to calibrate each pixel 28 after its circuit board 32 is populated and mounted on the scintillator, but before the assembled pixel 28 is mounted into the Compton telescope 20 chassis. A radioisotope 46 or electron beam source produces a collimated beam of electrons or gamma rays of known energy. Lead bricks 48 with a small hole 50 provide collimation in the example shown. The scintillator pixel 28 is clamped onto a computer-controlled X,Y stage 52, and the pixel's electronic connector 34 is inserted into a socket 54 as shown. A ribbon cable 56 or similar multi-wire cable brings supply power to the printed circuit board 32 and carries the signals back to a data acquisition computer. A computer program scans the X,Y stage and analyzes all signals to map out the response of all photodetectors 30 as a function of the position of incident electrons or gamma rays, providing the (x, y, energy) calibration for the pixel 28. Radioisotope sources with different gamma energy peaks may be used to calibrate the pixel 28 response at multiple energies if this additional information proves to be useful. The calibration data are stored in a file and the pixel 28 is tagged with an identifier unique to that calibration data set.

Figure 7:
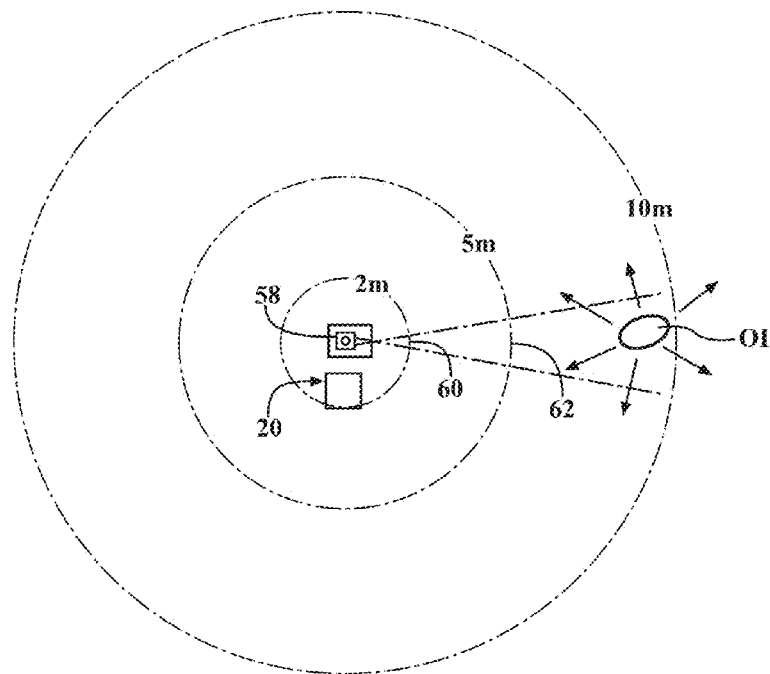
FIG. 7 is a top view of a shielded, moderated, collimated, pulsed neutron source for one possible application of this invention.

FIG. 7 shows a top view of a shielded, moderated, collimated, pulsed neutron source 58, which is a part of one application for one possible embodiment of this invention. The pulsed neutron source 58 is located about 1.5 meters from a shielded Compton telescope 20, as described in this invention. Concentric circles indicate the 2-meter, 5-meter, and 10-meter ranges from the neutron source 58. Most thermal neutrons travel in a range of velocities from about 1000 m/s to 4000 m/s, while gamma rays travel at the speed of light ($3 \times 10^8$ m/s). Therefore a 100 microsecond-long pulse of thermal neutrons will exit from the neutron collimator after a few hundred microseconds have elapsed. Within 0.5 milliseconds the leading edge of the neutron pulse passes the 2-meter range 60. After 2 milliseconds have elapsed, the trailing edge of the neutron pulse is passing the 2-meter mark while the leading edge has already passed the 5-meter mark 62. At some point, the thermal neutrons reach an Object of Interest (OI), causing PGNAA gamma rays to be emitted in all directions. These prompt gamma rays return to the Compton telescope 20 within a few nanoseconds of the time they are stimulated, a negligible time when compared to the thermal neutron time-of-flight. Therefore the neutron time-of-flight can be computed from the known range (determined by independent means, such as optical or radar sensing) of an object producing neutron-activation prompt gamma rays of interest that are detected by the Compton telescope. The length and duty cycle of the neutron pulsing can be then be modulated from the knowledge of the neutron time-of-flight in order to maximize detection effectiveness for a given range. Gating the Compton telescope 20 to select only events within certain time windows relative to the neutron pulse can enhance the signal to background ratio for events at a selected range.

Figure 8:
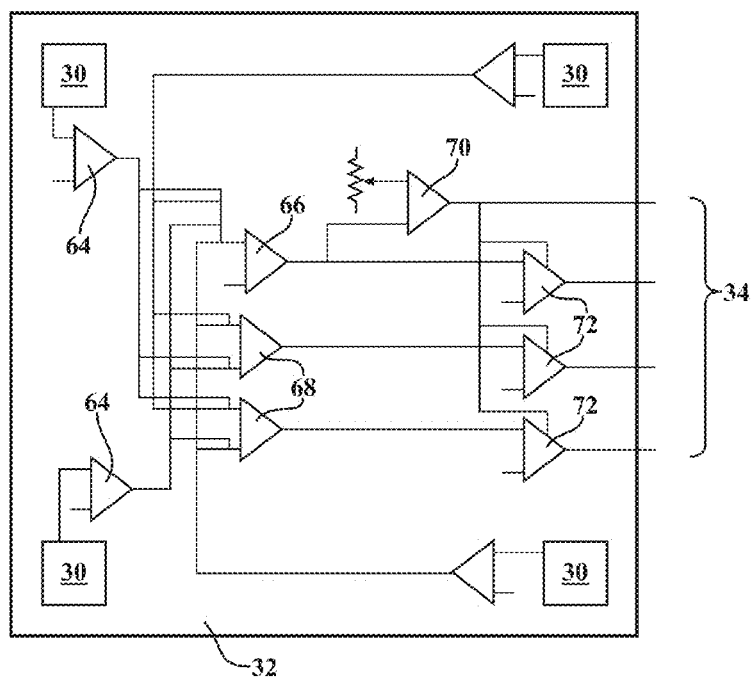
FIG. 8 shows a schematic diagram for components used on a single pixel printed circuit board in one embodiment of the invention.

FIG. 8 shows a schematic diagram of some of the components that would be used on a single pixel 28 printed circuit board 32. In one embodiment of the circuit board 32, a 2×2 array of four photodetectors 30 produce current pulses that are amplified by pre-amplifiers 64 with optimally matched active filters. The outputs of the four photodetectors 30 go to a summing amplifier 66 to produce a signal proportional to the total energy deposited, and two difference amplifiers 68, which produce voltages proportional to an x-coordinate and a y-coordinate, respectively, within the pixel 28. The output of the summing amplifier 66 goes to a comparator 70, also known as an analog signal threshold detector (70), which produces a trigger pulse if the signal exceeds a set energy threshold. When the trigger fires, it activates three pulse-integrating analog sample-and-holds 72, which store the (x, y, and energy) signals from the pixel 28 for a period from 20 to 100 nanoseconds as needed for downstream signal processing. The trigger signal and the three analog signals are passed through the electronic connector outputs 34 to the Layer Data 74 and Vector Data 44 processing subsystems.

FIGS. 9 and 10 show schematic diagrams of the signal processing subsystems for one example embodiment. In FIG. 9, all pixels 28 in a layer 24 pass their trigger and (X, Y, energy) analog signals along multiwire conductors 40, such as RF-shielded ribbon cables, to the Layer Data processor 74. As shown in FIG. 10, the Layer Data processor 74 for each layer 24 digitizes selected events and then passes the digitized data to the Vector Data processor 44 for further signal processing. To reduce the number of expensive signal-processing components such as fast analog-to-digital converters (digitizers), the analog pulses from all pixels 28 in a layer 24 are passed into inexpensive analog multiplexors (MUXs) 76. The Layer Data 74 signal processing subsystem receives a trigger signal from any pixel 28 where an above-threshold event occurs. In most cases, a single energetic gamma ray will deposit energy in one pixel 28 of one layer, then Compton scatter forward one or more times, depositing energy in one or more other layers. The trigger signals from the approximately 50 to 100 pixels 28 in a single layer 24 pass into a fast digital encoder system 78 (which may include a fast Field Programmable Gate Array or FPGA) in the Layer Data subsystem 74. The digital encoder system generates an index number to select the analog (x, y, energy) signals in the analog MUX system from the pixel 28 that was triggered. The selected (x, y, energy) signals are digitized by fast analog-to-digital converters 80. In this way, only 3 digitizers 80 are needed (one x, one y, one energy signal) to capture all the relevant signal data for a layer 24 of 50 to 100 pixels 28. The pixel 28 index number, associated (x, y, energy) data, and trigger pulse from a triggered pixel 28 in each layer 24 are passed downstream to the Vector Data processing system 44. Coincidence detection circuits in the Vector Data processing system 44 identify groups of trigger events that fall within a trigger time window (for example, within a 20 nanosecond period) across all layers 24 of the Compton telescope. The Vector Data processing system 44 can only calculate the gamma ray momentum vector for gamma ray events that Compton scatter and deposit sufficient energy in at least two layers 24 of the Compton telescope. A fast FPGA 42 will apply a series of selection rules to each set of time-coincident multilayer 24 trigger events with their pixel 28 index numbers and energy data, to see if the events represent a Compton scatter track for an incident gamma ray in an energy range of interest (for example, 10.8 MeV for gammas from nitrogen or 7.8 MeV from chlorine). In the occasional cases where two high-energy gamma rays over the energy threshold arrive within a single coincidence time window at the Compton telescope, anti-coincidence logic may be used in the Vector Data FPGA 42 to reject one or both of the gamma ray tracks if the simultaneous events result in ambiguity or lost data. The number of digitizers and processors per layer 24 could be increased if necessary to achieve higher event rate tracking. However, models of some anticipated applications of this invention show that an event tracking rate of 10 million events per second (any coincidence window shorter than 100 nanoseconds) is sufficient for the most likely operational scenarios.

Figure 11:
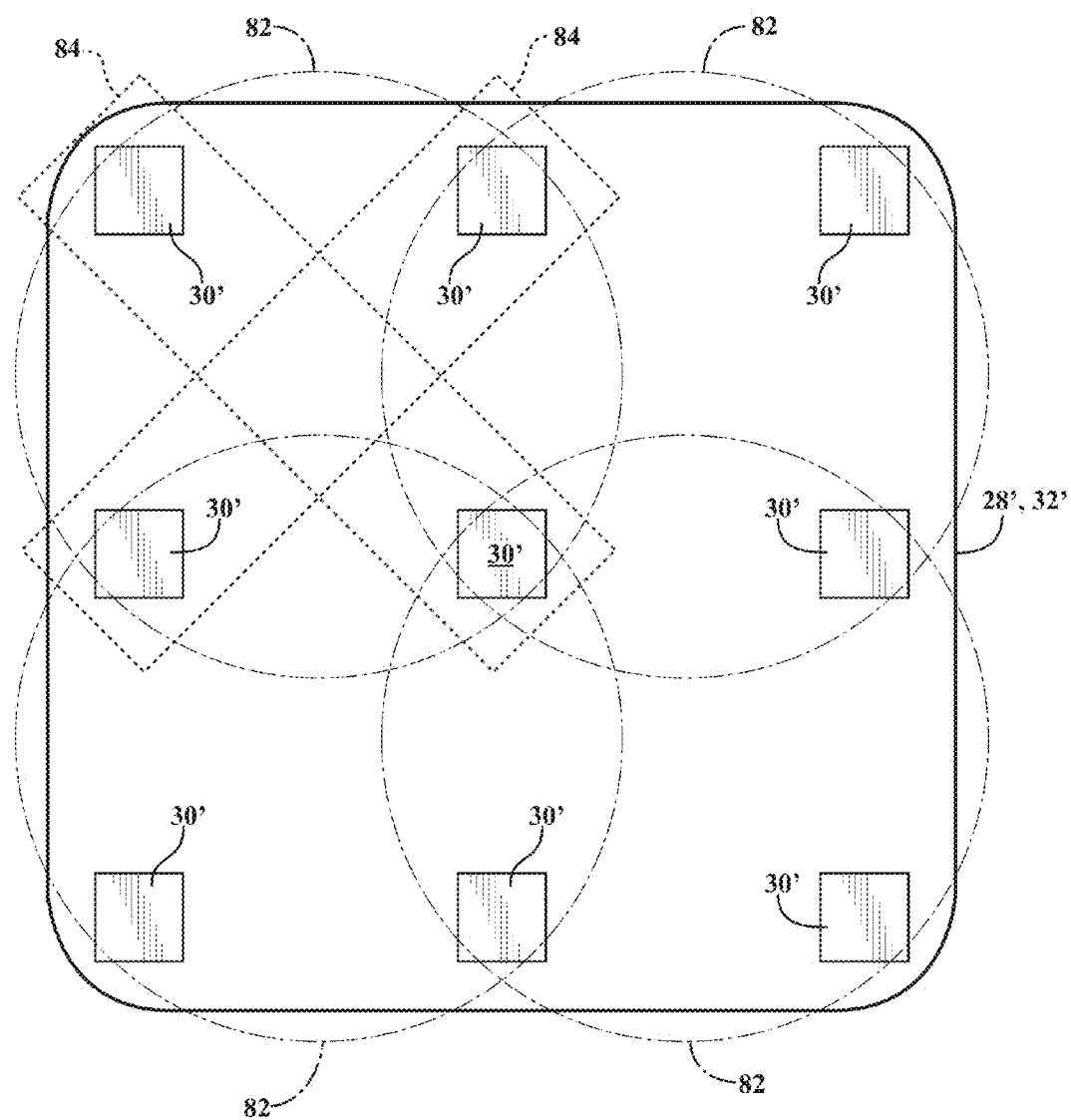
FIG. 11 is a photodetector array arranged on a single pixel according to an alternative embodiment of the invention.

FIG. 11 shows a different possible embodiment of a photodetector array 30' on a single pixel 28'. The 3×3 square grid of photodetectors 30' on a square pixel 28' with dimensions between 10 and 20 cm on a side may have cost/performance advantages, as described below. Each 2×2 grouping of photodetector 30' signals (dashed circles 82) would be summed in a summing amplifier to measure energy deposition in that quadrant of the pixel, while diagonally opposite photodetectors 30' in each 2×2 grouping would pass their signals to differential amplifiers to generate signals giving the (x,y) position of any gamma ray collision within that quadrant of the pixel 28—dotted rectangles 84 indicate two pairs of photodetectors 30' that would produce differential signals. The other six rectangles 84 have been omitted from FIG. 11 for clarity.

The embodiment of the pixel 28' design shown in FIG. 11 comprises a 3×3 square array of photodetectors 30', which may have several cost and performance advantages. By summing the photodetector 30' signals in square 2×2 groups of four (dashed circles 82), the energy deposited in any one quadrant of the pixel 28' can be measured. By taking the difference signals between diagonally opposite photodetector 30' pairs within any 2×2 group (two example pairs are emphasized in the two dotted rectangles 84), a measurement of the (x,y) collision position within that grouping can be uniquely determined. The photodetectors 30' in the center and along the middle of each edge can serve double or quadruple duty by contributing to the sums and differences from multiple quadrants. In effect, this photodetector 30' geometry achieves a better coverage of detector area per photodetector 30' than any pixel 28 with equivalent area per photodiode 30 in a 2×2 configuration. This strategy to maximize component coverage, or equivalently to minimize component cost per unit area for a given performance, may lead one to presume the extreme of a single huge detector pixel 28' with a grid of photodetectors 30' covering the entire Compton telescope 20 area; but this would not likely be practical. The cost advantages of small pixel 28' mass-production could be lost in large single-plate geometries. In practice the marginal returns of lower component cost per unit detector area (at a given performance level) would appear to rapidly diminish for photodetector 30' arrays larger than 3×3 or 4×4 photodetectors, which is why the 3×3 array is consider a preferred embodiment.

When a 10.8 MeV gamma-ray is incident on the front face of a Compton telescope 20 constructed according to the principles of this invention, a number of interactions may occur. Most commonly, the gamma ray will pass through one or several layers 24 of the plastic scintillator with no interaction, and then will Compton scatter from an electron in one of the scintillator layers. Typically between 1 MeV and 10 MeV of the gamma ray energy will be transferred to the electron, while the scattered gamma ray continues forward in a new direction carrying the remainder of the original 10.8 MeV energy. The recoil electron from the Compton scatter event deposits its energy in the plastic scintillator near the location of the first collision, producing a fluorescent signal that is measured by several photodetectors 30 on that pixel 28 to determine its (x,y) location within the pixel 28 and the amount of energy deposited. If the scattered gamma ray then goes on to deposit the rest of its energy in subsequent layers 24 of the Compton telescope, this two-point or multi-point interaction often gives enough information to calculate the initial momentum and direction of the incident 10.8 MeV gamma ray.

While hundreds of thousands of gamma rays will typically hit the Compton telescope 20 per second, over 99.9% of them will be ignored by the signal processing system because their total energy will be below 9 MeV. Since the plastic scintillator pixels 28, 28' and photodetectors 30, 30' in this exemplary embodiment have an exemplary 10-nanosecond response time, even a million gamma ray events per second can easily be separated in time by fast analog triggering. At the individual pixel 28 level in this example, only events depositing more than 0.6 MeV (or other threshold based on suitable laboratory data) will trigger the sample-and-hold amplifiers that pass the signal on to Layer Data 74 and Vector Data 44 systems (see FIGS. 8, 9, and 10). Clusters of multiple pixel 28 trigger events that occur in multiple layers 24 within a suitable gamma-ray time-of-flight window (for example 20 nanoseconds) will be summed across all telescope 20 layers 24 using the fast FPGA 42 in the Vector Data processor 44. Only those clusters of events whose total energy sums to a value over 9.0 MeV (or some revised threshold based on suitable data) will be selected for further vector analysis in the Vector Data Processor 44.

The Vector Processor 44 applies a series of selection rules to each qualifying cluster event to determine if that gamma ray momentum is trackable by Compton Scattering laws. A first selection rule may require the event cluster depositing at least 0.6 MeV (or other appropriate threshold to be determined) in at least two different detector layers 24 to produce useful vector information. Event clusters that pass the first selection rule are then calibrated to improve their energy resolution using lookup tables generated by pixel 28 calibration during instrument fabrication. A second selection rule may require the energy-calibrated events to sum to a total energy between 9.3 and 11.3 MeV (or other thresholds to be determined). A third selection rule may evaluate the (x,y,z) position and energy deposited in the first collision event, and compare that to the (x,y,z) position of the second collision event, and the total energy of all concurrent events, to see if the direction vector and gamma ray energies before and after the first collision are consistent with the law of Compton scattering for a 10.8 MeV gamma ray incident on the front face of the Compton telescope.

Figure 12:
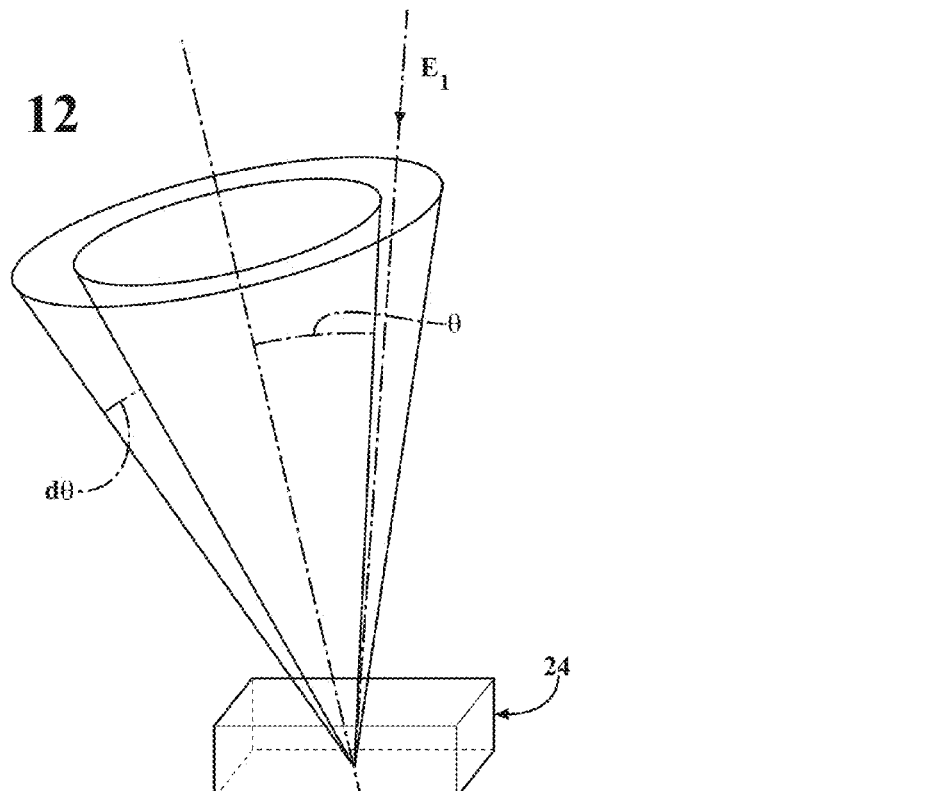
FIG. 12 is a diagrammatic view showing the relationship between the energy of an incident gamma ray and the energy of the scattered gamma ray after a Compton scatter interaction.

FIG. 12 shows the relationship between the energy of an incident gamma ray E1, the energy of the scattered gamma ray E2 after a Compton scatter interaction in one layer 24 of a Compton telescope, and the scattering angle θ between the incident ray and the scattered ray as determined by conservation of energy and momentum in a 2-body collision between an electron at rest and an energetic gamma ray. A successful capture of the energy from one Compton scatter event, plus the capture of the remaining energy from the scattered gamma ray E2 on a subsequent layer 24, allows the Vector Data system 44 to compute the angle θ and reconstruct a cone-shaped zone of probability for the direction of the incident gamma ray. The width of the circular zone dθ is determined by the uncertainty in the (x,y,z) positions of the first and second interaction and the uncertainty in the energy measurements.

The law of Compton scattering, based on the conservation of momentum and energy in a 2-body collision between a gamma ray and an electron, requires that the scattering angle θ of the gamma ray, as shown in FIG. 12, must fulfill the following condition:

$$\cos(\theta) = 1 - mc^2\left(\frac{1}{E_1} - \frac{1}{E_2}\right),$$

where:
m=the rest mass of the electron
c=the speed of light
$E_1$=the energy of the incident gamma ray
$E_2$=the energy of the Compton-scattered gamma ray If a cluster of events within a suitable time window, for example 20-nanoseconds, produces a result incompatible with the Compton scatter relation and the detector geometry, then that cluster of events will be rejected as an artifact. By way of example, a result incompatible with the Compton scatter relation and the detector geometry may arise if the calculated angle implies that the gamma ray came from behind or through the sides 26 of the Compton telescope 20 rather than from the front. Non-Compton-scatter artifacts can be produced for example when the first gamma-ray interaction in the Compton telescope 20 is an electron-positron pair production, followed by positron annihilation, instead of a Compton scatter event. Other examples of artifacts include cases where two energetic gamma rays happen to enter the Compton telescope 20 within the same (e.g., 20 nanosecond) time window, or where a Compton recoil electron generates a high energy bremsstrahlung photon that carries too much of the energy from the first Compton scatter into another layer 24 of the Compton telescope. MCNP5 models indicate that a Compton telescope 20 with 7 layers 24 of PVT-based scintillator, each 10 cm thick, will achieve a clean Compton scatter event, followed by capture of enough of the remaining gamma ray energy in subsequent layers 24 to apply the Compton scatter law, in up to 15% of cases where a 10.8 MeV gamma ray is incident on the front face of the Compton telescope. By comparison, the CompTel two-layer gamma ray telescope 20 had capture efficiency less than 2% for this scenario.

The digital data from those events that meet all the selection criteria including the Compton scatter law are passed from the Vector Processor 44 to a data acquisition system on a computer with hardware and software that generates an image of the 9 MeV to 11 MeV gamma ray landscape in the field of view of the Compton telescope.

Since the scattering angle θ of the first Compton scatter interaction in the telescope 20 does not uniquely determine the direction of an incident gamma ray, the intensity of the gamma ray image must be expressed as a cone-shaped zone of probability for each gamma ray event acquired, as indicated in FIG. 12. The opening angle θ of the cone-shaped zone is derived by the Compton Scatter relation, and the width of the band around that angle is a function of the estimated uncertainty in the (x,y,z) positions of the interactions that define the respective energy depositions in the successive layers 24, and the estimated uncertainty in the energy measurements themselves, which lead to an uncertainty band dθ around the calculated angle θ. It is clear then that a single gamma ray event cannot yield a very good image with high statistical confidence. However, as multiple gamma rays are acquired, the circular zones of confidence for a given gamma ray source at a given energy (10.8 MeV in this example) overlap only in the direction of the actual source, producing a high confidence image of that source.

Figure 13:
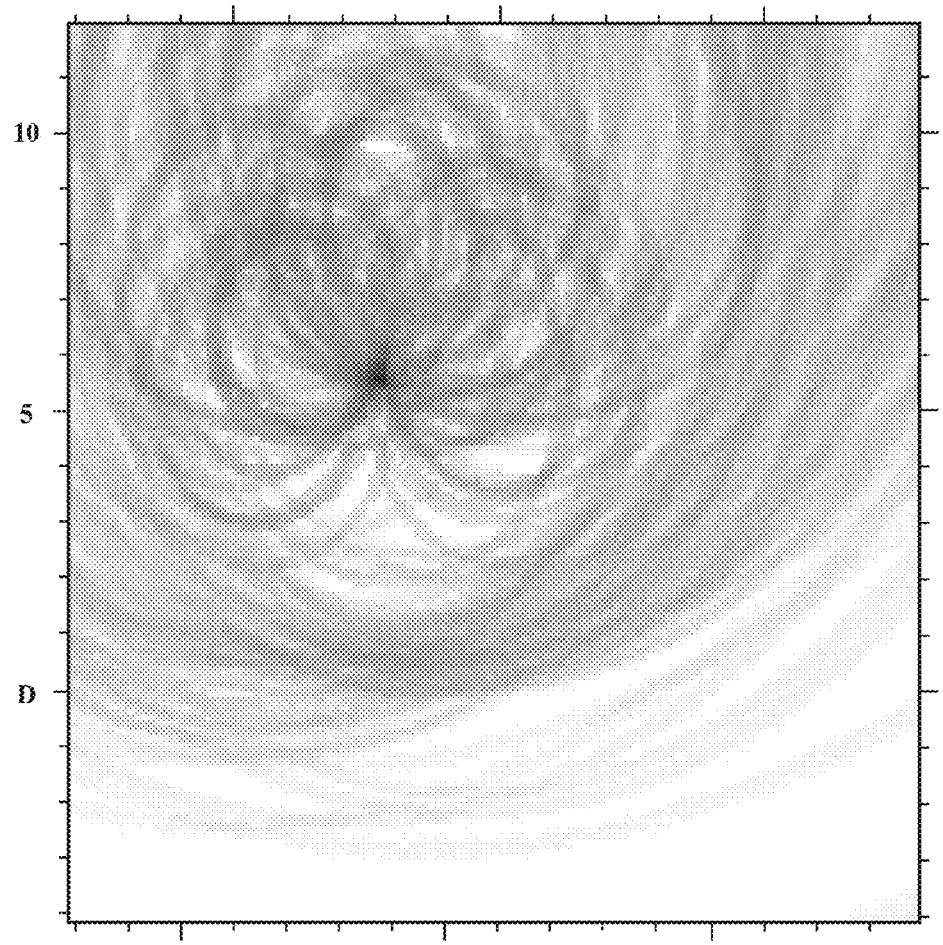
FIG. 13 is an image of experimental data from a small laboratory-scale Compton telescope viewing a cesium-137 radioisotope 662 keV gamma ray source.

This is shown in FIG. 13 which represents experimental data from a small laboratory-scale Compton telescope 20 viewing a cesium-137 radioisotope 662 keV gamma ray source a few cm away. (B. F. Phlips, S. E. Inderhees, R. A. Kroeger, W. N. Johnson, R. L. Kinzer, J. D. Kurfess, B. L. Graham, N. Gehrels, "Performance of a Compton Telescope using Position-Sensitive Germanium Detectors," IEEE Trans. on Nuc. Sci., 43, No. 3, p. 1472, 1996.) The gray rings in the image show circular zones of probability generated by individual Compton-Scattering events. The intersection of many gray rings at a single point indicates the location on the image of the actual radioisotope source.

Figure 14:
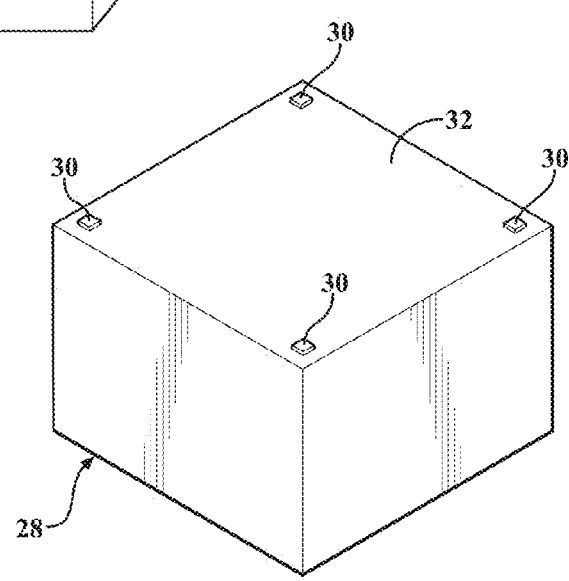
FIG. 14 shows a simple rectangular scintillator pixel according to one embodiment of the invention.

FIG. 14 shows a simple 14×14×10 cm rectangular scintillator pixel 28 with four 5×5 mm avalanche photodiodes 30 (APDs) mounted thereto. This pixel 28 is modeled using Monte Carlo methods to predict the optical signal measured by each photodetector 30 as a function of the (x,y) position of a gamma ray scattering event in the pixel 28.

Figure 15A:
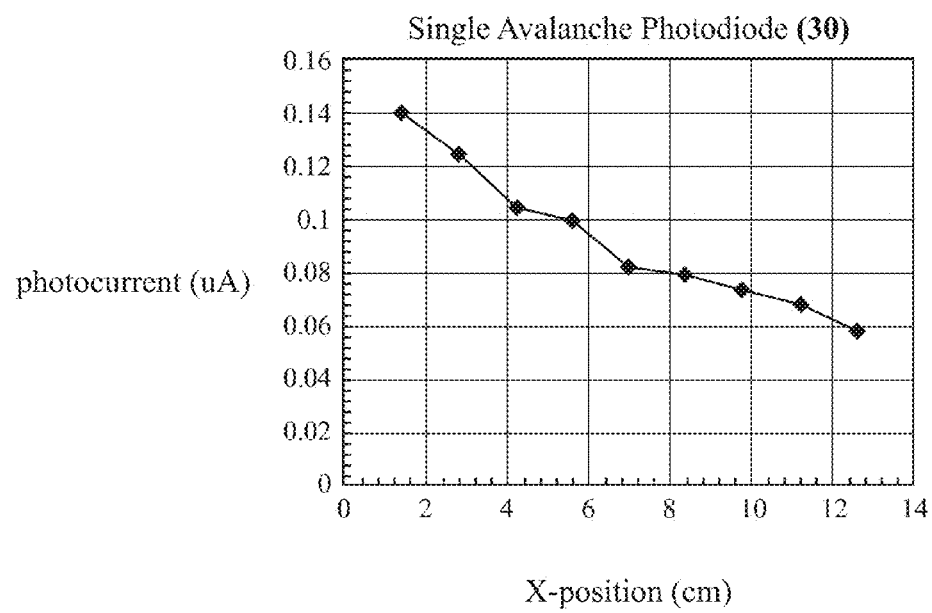
FIGS. 15A-D are respective data graphs showing the results of a Monte Carlo simulation.
Figure 15B:
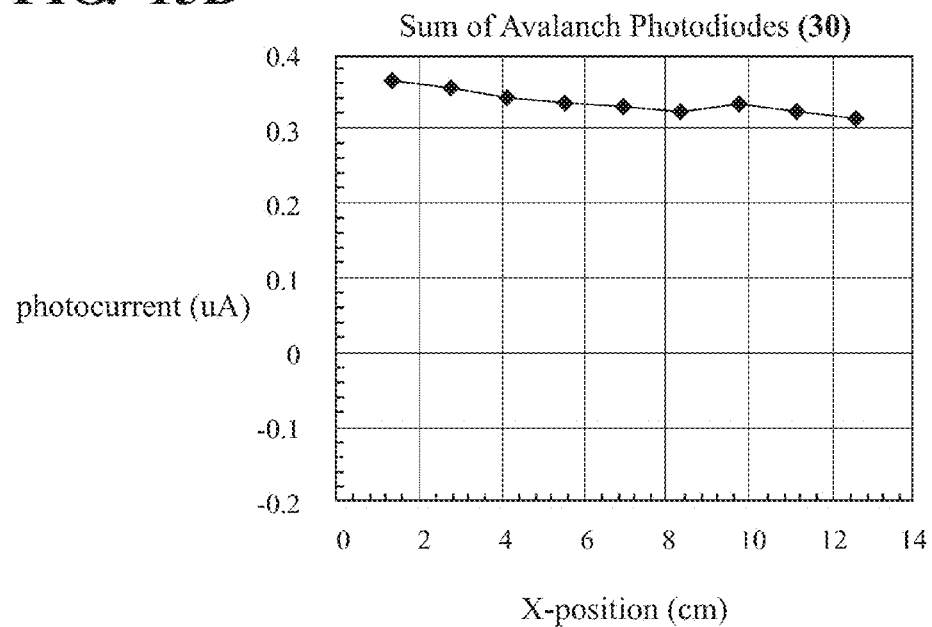
Figure 15C:
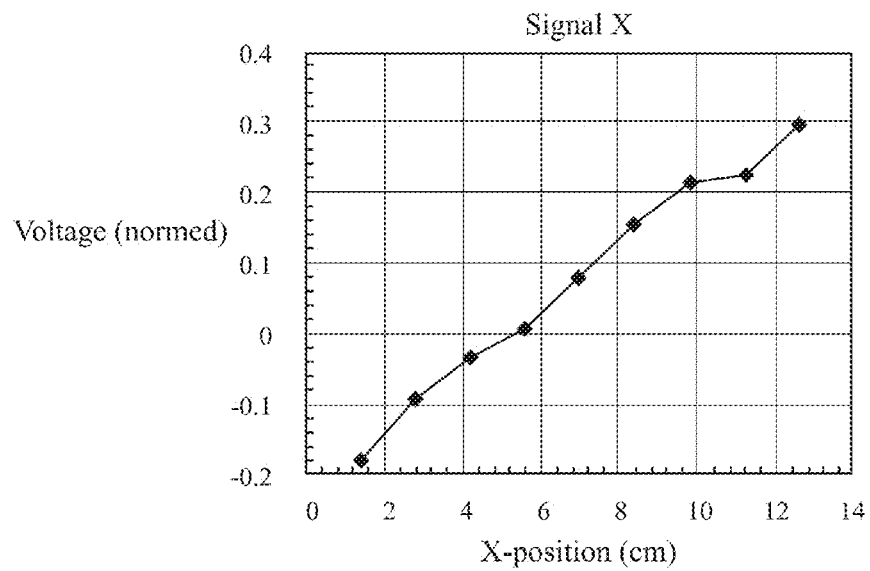
Figure 15D:
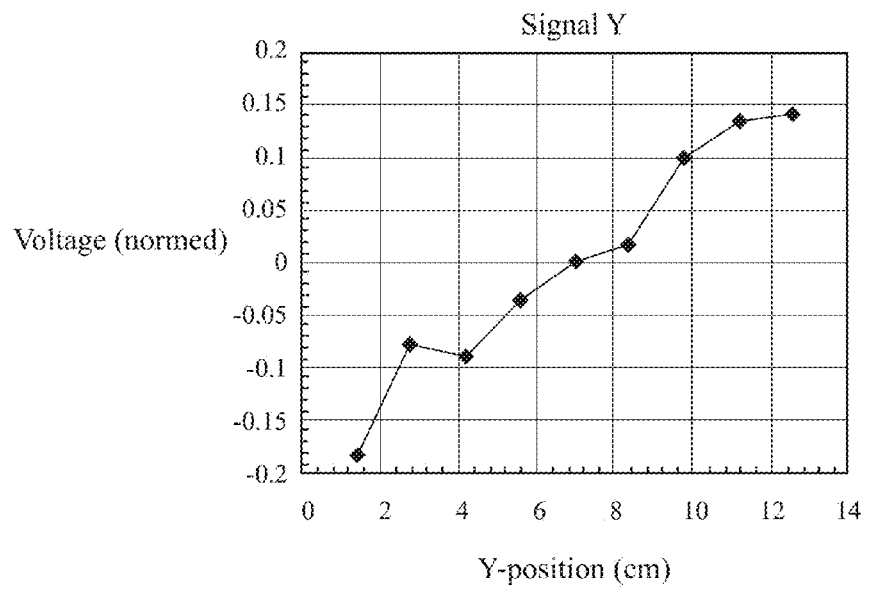

FIGS. 15A-D show the results of the Monte Carlo simulation. In FIG. 15A, the predicted signal from APD 30 in micro-Amps is lower when the Compton scatter event happens further away from that APD 30. In FIG. 15B, the sum of all four photodetectors 30 is nearly uniform, as expected. In FIG. 15C, the difference signal between the left/right pairs of ADPs 30 gives a clear indication of the position of the Compton scatter event. In FIG. 15D, we see some statistical noise in the difference signal between the top/bottom pairs of APDs 30, which accurately reflects the expected statistical fluctuation in the photon statistics from scintillation light on the APDs 30. Nevertheless, Signal Y still gives a good indication of the position of the Compton scatter event. This model predicts the result of the (x,y) calibration procedure shown in FIG. 6 for the pixel 28 geometry in FIG. 14. The resulting data indicate that a lookup table or fit function can be created that uniquely maps the combination of the photodetector 30 sum and (x) and (y) difference signals to the (x, y, energy) information required from each pixel 28.

Other relevant data, such as data from coincidence or anti-coincidence detectors, from time-of-flight measurements related to a pulsed neutron source, or from visible/infrared image acquisition systems may be integrated with the gamma ray image in the data imaging computer, and post-processing of the data in this computer may provide interpretive results (such as statistical confidence of a threat detection or object of interest) to the Compton telescope 20 user, depending on operational and user interface requirements.

The present invention differs from prior Compton telescope 20 designs in several compelling ways. For instance, as stated earlier, costs are reduced by using multiple layers 24 of organic scintillator pixels 28, 28' for all or most of the active gamma-detecting mass in the instrument. Most proposed and constructed Compton telescopes have used very expensive cryogenic semiconductor detectors or combinations of semiconductor detectors and inorganic scintillators, which are typically more than 10 times as expensive per unit of detector mass as inorganic scintillators. Even in the prior art CompTel design, which used low-cost organic scintillators for one of its two detection layers, over 85% of the active telescope 20 detector mass was in the form of the much more expensive inorganic scintillator NaI(Tl). The use of much less expensive organic scintillators 28, 28' for at least three detector layers 24 in the present invention allows the total gamma detection mass to be scaled up to large collection area and high collection efficiency at substantially reduced price. Monte Carlo analyses have shown that by placing five to ten organic scintillator layers 24 in front of one another as suggested FIG. 3, the gamma ray capture efficiency can be boosted from the roughly 1% range achieved in the 2-layer 24 CompTel instrument up to capture efficiencies near 15%. This has not been attempted in the past because the gamma ray literature describes organic scintillators as having poor energy resolution. However, although it is difficult to calibrate organic scintillator detectors due to their low gamma ray capture efficiency, when calibrated they have achieved energy resolution of 4% to 6% or better in the energy range 0.8 to 1.8 MeV, and better than 4% energy resolution at higher energies. See for example H. H. Vo, S. Kanamaru, C. Marquet, H. Nakamura, M. Nomachi, F. Piquemal, J. S. Ricol, Y. Sugaya, and K. Yasuda, "Energy Resolution of Plastic Scintillation Detector for Beta Rays", IEEE Trans. Nucl. Science, Vol. 55, No. 6, p. 3723, (2008).

Furthermore, costs are reduced and gamma ray capture efficiencies are increased in the present invention relative to prior Compton telescope 20 designs by optimizing the design for a particular gamma ray energy of interest, accepting modest energy resolution such as 5% at that design energy, and accepting modest angular resolution such as 0.05 to 0.09 radians (3° to 5°). The design requirements of other Compton telescopes specify energy and angular resolutions better than this over a very wide energy range, to observe a wide variety of different phenomena, and result in accordingly much higher detector costs. Industrial and security applications, however, can generally be served by a narrow energy range detector. For example, the 10.8 MeV gamma ray emitted by nitrogen is the primary energy of interest for PGNAA detection of large concealed explosives. Monte Carlo models show that for any given gamma ray energy, there is an optimal organic scintillator thickness that maximizes the multi-layer 24 Compton telescope 20 capture efficiency for that particular energy.

For mass-production and rapid assembly, the preferred embodiment of the present invention uses a large array of identical organic scintillator pixels 28, 28'. Each pixel 28, 28' has several photodiodes or avalanche photodiodes 30, 30' in a regular pattern bonded onto a factory-cut or factory-molded organic scintillator block or scintillator container, as shown in FIG. 4. The photodetectors 30, 30' with their appropriate power supply lines and pre-amplifiers will be attached to a printed circuit board, for example, by a "pick-and-place" machine with surface-mount and solder reflow technology, as is standard in the electronics industry for automated assembly of circuit boards. Then the printed circuit board 32, 32' with photodetectors 30, 30' will be bonded to the scintillator using index-matching optical adhesives of the type used for optical assemblies in the telecommunications industry. In this way hundreds or thousands of identical scintillator pixels 28, 28' can be assembled by automated machinery of the type that already exists in the electronics and telecommunications industries. The pixels 28, 28' will then be mounted in a large chassis (FIG. 5) using brackets, clips, fasteners, or other suitable techniques. The pixel electronics will interface using board edge-connector sockets 38, Zero Insertion Force (ZIF) sockets, ribbon cable connectors, or similar socket devices, to circuit cables or circuit traces on the chassis that connect to telescope 20 signal processing sub-units called Layer Data Processors 74 and Vector Data Processors 44, as described.

While most scintillator-based gamma-ray detectors use photomultiplier tubes (PMTs) to capture the light resulting from gamma ray induced scintillation, the present invention preferably uses an array of photodiodes, or avalanche photodiodes 30 instead, to reduce the amount of non-scintillator mass inside the telescope 20 that would otherwise reduce the Compton telescope 20 efficiency, to increase the mechanical robustness of the telescope, and to reduce the cost of telescope 20 assembly by enabling the use of printed circuit board 32 and optical telecommunications automated manufacturing techniques.

With at least three photodetector 30 elements on each pixel 28 in a triangular array, or at least four photodetector 30 elements on each pixel 28 in a rectangular array, each pixel 28 will produce multiple output signals when energy is deposited by a gamma ray. The signals from different photodetectors 30 will vary as a function of the (x,y) position of the gamma ray collision in the pixel 28. The differences between adjacent photodetector 30 signals will give the (x,y) location of the signal, and the sum of all photodetectors 30 will indicate the total energy deposited in the pixel 28. In other words, the invention here proposes a scintillator pixel 28 (or 28', etc.) having at least 3 photodetectors 30 together with a control system whereby the sum of the adjacent photodetectors 30 produces a signal indicating the gamma energy deposition, and the difference of adjacent photodetectors 30 divided by (i.e., normalized by) the sum produces a signal indicating the gamma interaction location within the respective pixel 28. Most preferably, the photodetectors 30 (or 30', etc.) are APDs, photodiodes, or Avalanche-mode solid-state photomultipliers.

One of the main sources of uncertainty in scintillator measurements of gamma ray energy is the variation in signal strength as a function of the collision position within a scintillation detector. For conventional gamma ray detectors with one large PMT on one side of the scintillator, interactions at different locations produce slightly different efficiencies in coupling the scintillator light into the PMT. PMTs in general also have a slight non-uniformity in response across their face. However, with multiple photodetectors 30 distributed across the face of the scintillator pixels 28, the effect of interaction position on total signal can be corrected by calibration. The calibration process can be automated by programming a scanning (x,y) stage at the pixel 28 factory to move a newly assembled pixel 28 across a collimated electron beam or collimated gamma ray source of known energy, recording the signals of the photodetector 30 elements as a function of (x,y) position and saving the resulting data in a lookup table that generates an (x, y, Energy) value for a given combination of signals, as shown in FIG. 6. If many pixels 28 are nearly identical in behavior, a single lookup table can serve as the calibration for an entire lot of pixels 28. If pixels 28 within one batch show significant variation, flash memory devices can be incorporated into the Compton telescope 20 signal processor to store coefficients that approximate each lookup table for each individual pixel 28 within a large Compton telescope.

For Compton telescope 20 applications that use PGNAA with an electronically-pulsed neutron source, the distance to an object producing neutron-activated gamma rays can be estimated by independent means, such as optical or radar sensing, and the corresponding neutron time-of-flight between neutron pulse generation and the returned gamma ray signal can then be calculated for use in gating the telescope. This concept is introduced generally in the co-pending PCT Patent Application Serial No. PCT/US10/30455, filed Apr. 9, 2010, the entire disclosure of which is hereby incorporated by reference. For example, if a 100-microsecond long pulse of neutrons is thermalized in a polyethylene moderator and then broadcast through a collimator at a variety of objects from 2 meters to 10 meters away, the neutron-activated prompt gamma rays from objects 2 meters away will mostly arrive at the Compton telescope 20 between 0.5 milliseconds and 2 milliseconds after the neutron pulse is generated; neutron-activated gamma rays from objects 5 meters away will mostly arrive at the Compton telescope 20 between 1.3 milliseconds and 5 milliseconds after the pulse. Objects 10 meters away will produce prompt gamma rays mostly between 3 and 10 milliseconds later, as in FIG. 7. Since organic scintillators have nanosecond response times, this technique could also work with pulses of fast or under-moderated (epithermal) neutrons.

The cost of electronics in the present invention is greatly reduced by collecting the signals from the large array of pixels 28 into Layer Data processors 74 and Vector Data processors 44, so that full signal processing electronics do not have to be included for every pixel, as in FIGS. 8-10. Each photodetector 30 may include a pre-amplifier to generate a voltage pulse when a gamma ray deposits energy in the pixel 28. Difference amplifiers generate (x,y) signals within the pixel, and a summing amplifier generates a total energy signal. If the total energy signal in one pixel 28 exceeds a pre-set trigger threshold, then sample-and-hold circuits acquire the pixel 28 sum signal and the two difference signals. These signals may be passed forward to analog multiplexers for each layer 24 of the Compton telescope 20. The analog trigger signals from pixels 28 in each layer 24 are processed by a digital encoder or fast Field Programmable Gate Array (FPGA) 78 in the Data Layer 24 processor to identify the pixel 28 where each event occurred. The Data Layer 24 processor then activates the analog multiplexers to select only the delayed analog pulses from the pixel 28 of interest for digitization in the Analog-to-Digital (A/D) converters (digitizers) 80. In this way only three digitizers 80 are needed to acquire the (x, y, energy) signals from the entire array of pixels 28 in one layer, as long as above-threshold events are separated in time by periods longer than the processing interval, approximately 20 to 100 nanoseconds. Finally, the FPGA 78 for each layer 24 of the gamma telescope 20 generates the (x, y, energy, and time) coordinates of each above-threshold event and passes this numerical data to a Vector Processor 44. The Vector Processor 44 uses the (x, y, energy, and time) information and the Compton scattering equations to group coincident multilayer events together, sum the total energy deposition from each gamma ray, and calculate the incident energy and momentum from gamma ray events that meet certain selection criteria. Monte Carlo simulations indicate that a 7-layer 24 plastic organic scintillator telescope 20 can achieve up to 15% capture efficiency for 10.8 MeV gamma rays using coincidence, energy, and momentum vector selection criteria.

Embodiments of the present invention include Compton telescopes 20 using three or more layers 24 of scintillator pixels 28 to track Compton scattered incident gamma rays, in which at least two layers 24 are composed, at least in part, of organic scintillator materials. Embodiments of the present invention include Compton telescopes 20 that may have one or more layers 24 of inorganic scintillator pixels, such as NaI(Tl), along with at least two layers 24 of organic scintillator pixels 28 according to the principles of this invention. Embodiments of the present invention include Compton telescopes 20 using either liquid or plastic organic materials for the scintillator pixels 28, including liquid or plastic scintillators incorporating dissolved or suspended organometallic compounds such as tetra-ethyl-lead, tetra-phenyl-lead, tetra-methyl-tin, or other organometallic compounds whose purpose is to increase the gamma ray stopping power of the organic scintillator. This invention is distinguished from prior art concepts by the use of three (3) or more high-efficiency detector layers 24 composed of mass-producible pixels 28 using printed circuit boards 32. Preferably, all identical pixels 28 are identical throughout the entire telescope 20 device, however it is possible that one layer 24 may have pixels 28 of differing characteristics from the pixels 28 in next adjacent layer 24. As a result, practical industrial applications for large-area Compton telescopes 20 are made possible.

Embodiments of the present invention include scintillator layers 24 composed of arrays of square, rectangular, triangular, hexagonal, cylindrical or other geometrically efficient scintillator pixels 28. Each pixel 28 consists of a block or volume of scintillator material, typically unitary in construction and typically homogenous in composition, with at least three photodetectors 30 mounted on it to provide (x, y, energy) information for gamma ray collisions within that pixel, and may include arrays of larger numbers of photodetectors 30 in square, rectangular, triangular, hexagonal, (etc.) grids mounted on the surface of each scintillator pixel 28. Embodiments of the present invention include scintillator pixels 28 that use photodetectors 30 consisting of photodiodes, avalanche photodiodes, or solid-state photomultipliers, where the photodetectors 30 may be mounted on one common face of each pixel 28 or may be mounted along multiple faces of a pixel 28 to reduce obstruction of gamma rays traveling along the axis of the Compton telescope 20 or to provide better energy resolution if needed.

The foregoing invention has been described in accordance with the relevant legal standards, thus the description is exemplary rather than limiting in nature. Variations and modifications to the disclosed embodiment may become apparent to those skilled in the art and fall within the scope of the invention.

What is claimed is:

1. A Compton telescope-type gamma-ray imaging apparatus (20) including a plurality of scintillators (28), said device comprising:

a chassis, said chassis including at least three discrete layers (24) spaced-apart from one another and supported in an aligned, generally parallel orientation;

at least one gamma ray detector operatively disposed in each said layer (24);

each said gamma ray detector comprising a plurality of scintillator pixels (28);

said gamma ray detectors on at least two of said layers (24) including organic scintillator pixels (28), said organic scintillator pixels (28) each including a unitary volume of scintillator material having at least three semiconductor-based high-gain photodetectors (30) mounted thereon and configured to determine the (x,y) position and total energy deposited by a gamma ray collision inside the respective said organic scintillator pixel (28).

2. The apparatus (20) of claim 1, wherein said organic scintillator pixels (28) are fabricated from at least one of solid plastic scintillator and liquid scintillator material compositions.

3. The apparatus (20) of claim 2, wherein said organic scintillator pixels (28) contain up to 20% heavy metals by weight in the form of organometallic compounds.

4. The apparatus (20) of claim 1, wherein said scintillator pixels (28) are substantially identical to one another over the entirety of at least one said gamma ray detector.

5. The apparatus (20) of claim 1, wherein said at least three photodetectors (30) are selected from a group consisting essentially of low-noise photodiodes, avalanche photodiodes and solid state photomultipliers.

6. The apparatus (20) of claim 1, wherein said at least three photodetectors (30) are disposed in an array on each said scintillator pixel (28) such that the sums of and the differences between signals produced by adjacent said photodetectors (30) will yield a definable function of the position and total energy deposited by a gamma ray in that region of said scintillator pixel (28).

7. The apparatus (20) of claim 1, wherein each said scintillator pixel (28) has a plurality of sides, and wherein said at least three photodetectors (30) are located along different sides of said scintillator pixel (28).

8. The apparatus (20) of claim 1, wherein each said scintillator pixel (28) has an associated printed circuit board (32) including at least one photodetector power supply trace, photodetector preamplifier (64), and an electronic connector, and wherein said printed circuit board (32) further includes at least one analog sum amplifier (66) for summing the signals from a plurality of said photodetectors (30).

9. The apparatus (20) of claim 8, wherein said printed circuit board (32) further includes at least one analog differential amplifier (68) for subtracting the signals of adjacent said photodetectors (30).

10. The apparatus (20) of claim 8, wherein said printed circuit board (32) further includes at least one analog signal threshold detector (70) for generating a trigger signal when a pre-set trigger threshold is exceeded.

11. The apparatus (20) of claim 8, wherein said at least three photodetectors (30) are affixed to said scintillator pixel (28) with an index-matching optical adhesive.

12. The apparatus (20) of claim 1, further including housing walls (26) operatively associated with said chassis, said housing walls (26) including at least one of neutron shielding, gamma ray shielding, and coincidence/anti-coincidence detectors for improving signal/background ratio.

13. The apparatus (20) of claim 1, further including at least one fast programmable microprocessor for performing digital signal processing on groups of events.

14. The apparatus (20) of claim 1, further including a data analysis and imaging system for generating an image of the gamma ray field of view of said apparatus (20) based on an accumulation of multiple gamma events of interest in said gamma ray detectors.

15. The apparatus of claim 1, further including a non-transitory computer readable medium coded with instructions and executed by a processor to individually calibrate at least one organic scintillator pixel.

16. The apparatus of claim 15, wherein said computer readable medium coded with instructions and executed by a processor accesses at least one predetermined lookup table.

17. A method of operating a Compton telescope-type gamma-ray imaging apparatus (20) including plural scintillators (28), said method comprising the steps of:

supporting at least three discrete layers (24) of gamma ray detectors in spaced-apart generally parallel alignment;

each said gamma ray detector including a plurality of substantially identical scintillator pixels (28);

forming a plurality of the scintillator pixels (28) in at least two of the layers (24) from an organic scintillator material composition; and individually calibrating at least one organic scintillator pixel (28) to improve its (x,y) position and energy resolution characteristics, said calibrating step including correcting the energy measurement from at least one organic scintillator pixel (28).

18. The method of claim 17, wherein said calibrating step includes using a selected subset of one or more scintillator pixels (28) to represent the response of a plurality of scintillator pixels (28) for at least one of the gamma ray detectors.

19. The method of claim 17, wherein each said scintillator pixel (28) includes at least three semiconductor-based high-gain photodetectors (30) mounted thereon and configured to determine the (x,y) position and total energy deposited by a gamma ray collision inside the scintillator pixel (28), further including the step of deriving the (x,y) position of said gamma ray collision inside at least one scintillator pixel (28) using the difference signal between adjacent photodetectors (30) divided by the sum signal from adjacent photodetectors (30).

20. The method of claim 17, further including the step of identifying gamma ray tracks that interact in multiple layers (24) of gamma ray detectors by selecting event clusters that generate groups of trigger signals coincident within a predetermined time window.

21. The method of claim 17, further including the step of rejecting energetic particle events that do not contribute to the gamma ray image of interest on the basis that the energy depositions in all gamma ray detector layers (24) for that event do not produce a sum in the range of about 9.3 to 11.3 MeV.

22. The method of claim 17, further including the step of rejecting energetic particle events that do not contribute to the gamma ray image of interest on the basis that the energy depositions in all gamma ray detector layers (24) for that event do not produce a sum approximately equal to a predetermined gamma ray energy of interest.

23. The method of claim 17, further including the step of rejecting energetic particle events that do not contribute to the gamma ray image of interest on the basis that the event clusters do not generate pixel (28) triggers in at least two distinct gamma ray detector layers (24).

24. The method of claim 17, further including the step of pulsing a neutron beam, and disregarding undesirable background events contained within the scintillator pixel (28) responses as a function of neutron time-of-flight after each neutron pulse.

25. The method of claim 17, further including the step of disregarding undesirable background events contained within the scintillator pixel (28) responses as a function of conformity with the Compton scatter law and the field of view and angular acceptance of the Compton telescope apparatus (20).

* * * * *